(12) United States Patent
Lim et al.

(10) Patent No.: US 7,719,008 B2
(45) Date of Patent: May 18, 2010

(54) THIN FILM TRANSISTOR SUBSTRATE AND METHOD OF MANUFACTURING THE SAME AND MASK FOR MANUFACTURING THIN FILM TRANSISTOR SUBSTRATE

(75) Inventors: Do Gi Lim, Cheonan-Si (KR); Jong Hwan Lee, Anyang-Si (KR); Hong Woo Lee, Cheonan-Si (KR); Yong Jo Kim, Seoul (KR); Yong Woo Lee, Seoul (KR)

(73) Assignee: Samsung Electronics Co.,, Suwon-Si (KR)

( * ) Notice: Subject to any disclaimer, the term of this patent is extended or adjusted under 35 U.S.C. 154(b) by 92 days.

(21) Appl. No.: 11/496,320

(22) Filed: Jul. 31, 2006

(65) Prior Publication Data

US 2007/0181877 A1    Aug. 9, 2007

(30) Foreign Application Priority Data

Feb. 3, 2006    (KR) ...................... 10-2006-0010831
Feb. 8, 2006    (KR) ...................... 10-2006-0012147

(51) Int. Cl.
*H01L 31/20* (2006.01)

(52) U.S. Cl. .......................... 257/59; 257/66; 257/401; 257/E29.291; 257/E29.294; 349/43; 349/44

(58) Field of Classification Search .................... 257/59, 257/E29.291, 66, 401, E29.294; 349/43, 349/44

See application file for complete search history.

(56) References Cited

U.S. PATENT DOCUMENTS

| 5,473,168 | A | * | 12/1995 | Kawai et al. | .................... 257/61 |
| 6,046,479 | A | * | 4/2000 | Young et al. | ................. 257/350 |
| 6,573,955 | B2 | * | 6/2003 | Murade | ....................... 349/44 |
| 2002/0097364 | A1 | * | 7/2002 | kwon et al. | ................... 349/139 |
| 2003/0090601 | A1 | * | 5/2003 | Kim et al. | ...................... 349/43 |
| 2003/0117542 | A1 | * | 6/2003 | Choo | .......................... 349/43 |
| 2003/0178628 | A1 | * | 9/2003 | Aoki et al. | ..................... 257/83 |
| 2004/0066483 | A1 | * | 4/2004 | Kim | ........................... 349/141 |

FOREIGN PATENT DOCUMENTS

CN    1414422    4/2003

OTHER PUBLICATIONS

SIPO of PRC Office Action dated Nov. 13, 2009 for Application No.: 200610139729.2.

* cited by examiner

*Primary Examiner*—Tu-Tu V Ho
(74) *Attorney, Agent, or Firm*—F. Chau & Associates, LLC

(57) ABSTRACT

A thin film transistor substrate, wherein the moving area of electrons between source and drain electrodes of a thin film transistor (TFT) is minimized, the moving distance of electrons is increased, and the sizes of capacitors defined by a gate electrode together with the respective source and drain electrodes are identical to each other so that an off current generated when the TFT is off can be minimized; a method of manufacturing the thin film transistor substrate; and a mask for manufacturing the thin film transistor substrate. Accordingly, it is possible to minimize an off current induced due to a phenomenon of electron trapping by light.

10 Claims, 22 Drawing Sheets

711  710  720  700

910b 910a  920  900

THIN FILM TRANSISTOR SUBSTRATE AND METHOD OF MANUFACTURING THE SAME AND MASK FOR MANUFACTURING THIN FILM TRANSISTOR SUBSTRATE

CROSS-REFERENCE TO RELATED APPLICATIONS

The present application claims priority from Korean Patent Application No. 10-2006-0010831 filed Feb. 3, 2006 and No. 10-2006-0012147 filed Feb. 8, 2006, the disclosures of which are hereby incorporated by reference in their entirety.

BACKGROUND OF THE INVENTION

1. Technical Field

The present disclosure relates to a thin film transistor substrate, a method of manufacturing the same, and a mask for manufacturing a thin film transistor substrate. More particularly, the present disclosure relates to a thin film transistor capable of minimizing an off current of the thin film transistor.

2. Discussion of the Related Art

In general, a liquid crystal display (LCD) comprises a thin film transistor substrate on which a pixel electrode, a storage capacitor, a thin film transistor (TFT) for switching each pixel, and the like are formed; a common electrode substrate on which a common electrode and the like are formed; and liquid crystals sealed between the two substrates. In the LCD, a voltage is applied between the two substrates to drive the liquid crystals and to control light transmittance, thereby displaying images.

In such an LCD, a plurality of gate lines and a plurality of source lines are formed on a transparent glass substrate, a TFT is then provided in the intersection of the two lines, and a pixel electrode is formed to be connected to a drain electrode of the TFT.

In the operation of the LCD, if a gate voltage is applied to a gate electrode of the TFT through the gate line, the TFT is turned on. Accordingly, a data signal of a source line connected to a source electrode is applied to the drain electrode and then transmitted to the pixel electrode. The data signal applied to the pixel electrode in such a manner changes an electric field between the pixel electrode and the common electrode.

However, since such a TFT is provided with a region where electrons can be moved between a drain and a source when the TFT is off, an off current is present. Thus, there is a problem in that a residual image may be generated if there is an increase in the off current.

SUMMARY OF THE INVENTION

Accordingly, embodiments of the present invention are conceived to solve the aforementioned problems. An exemplary embodiment of the present invention provides a thin film transistor (TFT) substrate, wherein a leakage region between source and drain electrodes can be minimized, an off current can be minimized through extension of the moving distance of electrons, an influence by light on the TFT is suppressed to minimize the off current, and sizes of the capacitors formed respectively between a gate electrode and the source and drain electrodes are identical to each other to minimize the off current; a method of manufacturing the TFT substrate; and a mask for manufacturing the TFT substrate.

Embodiments of the present invention provide a thin film transistor substrate, comprising a plurality of gate lines; a plurality of source lines intersecting the gate lines; pixel electrodes provided in a plurality of pixel regions defined by the gate and source lines; and thin film transistors provided in the pixel regions, each of the thin film transistors including a gate electrode connected to one of the gate lines, a source electrode connected to one of the source lines, and a drain electrode connected to one of the pixel electrodes, wherein an active layer is exposed in a channel region provided between the source and drain electrodes of each of the thin film transistors, and the active layer protrudes outside the channel region by a length corresponding to 30% or less of the width of the source line.

In an exemplary embodiment, the source electrode includes first and second protruding portions extending toward both edges of the gate electrode, and a connecting portion for connecting the first and second protruding portions to each other; a portion of the drain electrode extends into a region between the first and second protruding portions; the channel region is provided between the drain electrode extending into the region between the first and second protruding portions, and the first and second protruding portions and the connecting portion; and the active layer is exposed only within the channel region. The first protruding portion may partially overlap with an edge of the gate electrode, and the length of the first protruding portion may be smaller than that of the second protruding portion.

The gate electrode may include a projecting portion formed such that a portion of the gate electrode protrudes in the direction of the drain electrode, and the projecting portion may partially overlap with an edge of the drain electrode.

Respective overlapping areas of the drain and source electrodes with the gate electrode are preferably identical to each other. The drain electrode includes a drain contact connected to one of the pixel electrodes, and a light-blocking portion is provided below the drain contact. The active layer is provided in a region below the source line.

Exemplary embodiments of the present invention provide a method of manufacturing a thin film transistor substrate, comprising the steps of forming a gate electrode and a gate line connected thereto on a substrate; forming a gate insulation film, an active layer and a conductive film on the substrate; applying a photosensitive film on the conductive film and patterning the photosensitive film to form a photosensitive mask pattern that shields a source electrode formation region having first and second protruding portions and a connecting portion for connecting them, a source line formation region connected to the source electrode formation region, and a drain electrode formation region partially extending into a region between the first and second protruding portions that shields a channel formation region provided between the drain electrode formation region partially extending into the region between the first and second protruding portions, and the first and second protruding portions and the connecting portion, and that has a thickness of the photosensitive film of the channel formation region smaller than those of the source and drain electrode formation regions; performing an etching process using the photosensitive mask pattern as an etching mask to remove the conductive film and the active layer in a region except the source electrode formation region, the source line formation region, the drain electrode formation region and the channel formation region; lowering the height of the photosensitive mask pattern to expose the channel formation region; and removing the conductive film through an etching process using the photosensitive mask pattern with the exposed channel formation region as an etching mask to form a source electrode including the first and second protruding portions and the connecting portion, a source line connected to the source electrode, a drain electrode extending between the first and second protruding portions, and a channel region with the active layer exposed between the two electrodes, wherein the active layer protrudes outside the channel region by a length corresponding to 30% or less of the width of the source line formation region.

An embodiment of the present invention provides a mask for manufacturing a thin film transistor substrate, comprising a source light-shielding portion corresponding to source electrode and source line regions of a thin film transistor, and a drain light-shielding portion corresponding to a drain electrode region; a translucent portion corresponding to a channel region of the thin film transistor; and a light-transmitting portion corresponding to a region except the source electrode region, the source line region, the drain electrode region and the channel region, wherein the translucent portion protrudes outside the channel region by a length corresponding to 30% or less of the width of the source line region.

In an exemplary embodiment of the present invention, the source light-shielding portion includes first and second protruding portions and a connecting portion for connecting them, the drain light-shielding portion partially extends into a region between the first and second protruding portions, and the translucent portion is provided only in a region between the drain light-shielding portion partially extending into the region between the first and second protruding portions, and the first and second protruding portions and the connecting portion.

Exemplary embodiments of the present invention provide a thin film transistor substrate, comprising a plurality of gate lines; a plurality of source lines intersecting the gate lines; pixel electrodes provided in a plurality of pixel regions defined by the gate and source lines; and thin film transistors provided in the pixel regions, each of the thin film transistors including a gate electrode connected to one of the gate lines, a source electrode connected to one of the source lines, and a drain electrode connected to one of the pixel electrodes, wherein the source electrode includes first and second protruding portions extending to both edges of the gate electrode and a connecting portion for connecting the first and second protruding portions to each other, wherein the lengths of the first and second protruding portions are different from each other.

In an exemplary embodiment, the first protruding portion partially overlaps with an edge of the gate electrode, and the length of the first protruding portion is smaller than that of the second protruding portion.

It is advantageous that the drain electrode partially extends into a region between the first and second protruding portions of the source electrode, an active layer is exposed in a channel region provided between the source and drain electrodes, and the active layer protrudes outside the channel region by a length corresponding to 30% or less of the width of the source line.

The gate electrode may include a projecting portion formed such that a portion of the gate electrode protrudes in the direction of the drain electrode, and the projecting portion partially overlaps with an edge of the drain electrode. Respective overlapping areas of the drain and source electrodes with the gate electrode may be identical to each other. The drain electrode may include a drain contact connected to one of the pixel electrodes, and a light-blocking portion may be provided below the drain contact. The active layer is provided in a region below the source line.

Exemplary embodiments of the present invention provide a method of manufacturing a thin film transistor substrate, comprising the steps of forming a gate electrode and a gate line connected thereto on a substrate; forming a gate insulation film, an active layer and a conductive film on the substrate; applying a photosensitive film on the conductive film and patterning the photosensitive film to form a photosensitive mask pattern that shields a source electrode formation region having first and second protruding portions with different extension lengths and a connecting portion for connecting them, a source line formation region connected to the source electrode formation region, and a drain electrode formation region partially extending into a region between the first and second protruding portions that shield a channel formation region provided between the drain electrode formation region and the source electrode formation region, and that has the thickness of the photosensitive film of the channel formation region smaller than those of the source and drain electrode formation regions; performing an etching process using the photosensitive mask pattern as an etching mask to remove the conductive film and the active layer in a region except the source electrode formation region, the source line formation region, the drain electrode formation region and the channel formation region; lowering the height of the photosensitive mask pattern to expose the channel formation region; and removing the conductive film through an etching process using the photosensitive mask pattern with the exposed channel formation region as an etching mask.

Exemplary embodiments of the present invention provide a mask for manufacturing a thin film transistor substrate, comprising a source light-shielding portion corresponding to source electrode and source line regions of a thin film transistor, and a drain light-shielding portion corresponding to a drain electrode region; a translucent portion corresponding to a channel region between the source light-shielding portion and the drain light-shielding portion; and a light-transmitting portion corresponding to a region except the source electrode region, the source line region, the drain electrode region and the channel region, wherein the source light-shielding portion includes first and second protruding portions and a connecting portion for connecting them, wherein the lengths of the first and second protruding portions are different from each other.

The first protruding portion partially overlaps with an edge of the gate electrode of the thin film transistor, and the length of the first protruding portion is smaller than that of the second protruding portion.

The translucent portion extends in directions of distal ends of the first and second protruding portions, and a distance between the distal end of the first protruding portion and the translucent portion is longer than that between the distal end of the second protruding portion and the translucent portion, or distances between the respective distal ends of the first and second protruding portions and the translucent portion are identical to each other.

Moreover, exemplary embodiments of the present invention provide a thin film transistor substrate, comprising a plurality of gate lines; a plurality of source lines intersecting the gate lines; pixel electrodes provided in a plurality of pixel regions defined by the gate and source lines; and thin film transistors provided in the pixel regions, each of the thin film transistors including a gate electrode connected to one of the gate lines, a source electrode connected to one of the source line, and a drain electrode connected to one of the pixel electrodes, wherein the gate electrode includes a projecting portion formed such that a portion of the gate electrode protrudes in a direction of the drain electrode, and the projecting portion partially overlaps with both edges of the drain electrode.

The projecting portion may include first and second projections, the first projection may partially overlap with one edge of the drain electrode, and the second projection may partially overlap with the other edge of the drain electrode.

The source electrode may include first and second protruding portions extending toward both edges of the gate electrode, and a connecting portion for connecting the first and second protruding portions to each other; a portion of the drain electrode extends into a region between the first and second protruding portions; an active layer is exposed in a channel region provided between the source and drain electrodes; and the active layer protrudes outside the channel region by a length corresponding to 30% or less of the width of the source line.

The source electrode may include first and second protruding portions, and a connecting portion for connecting the first and second protruding portions to each other, the first protruding portion partially overlaps with an edge of the gate electrode, and the length of the first protruding portion is smaller than that of the second protruding portion. Respective overlapping areas of the drain and source electrodes with the gate electrode may be identical to each other. The drain electrode may include a drain contact connected to one of the pixel electrodes, and a light-blocking portion may be provided below the drain contact. The active layer is provided in a region below the source line.

Furthermore, exemplary embodiments of the present invention provide a method of manufacturing a thin film transistor substrate, comprising the steps of forming a gate electrode with a projecting portion and a gate line connected thereto on a substrate; forming a gate insulation film, an active layer and a conductive film on the substrate; and patterning the conductive film and the active layer to form a source electrode, a source line, and a drain electrode with both edges overlapping with the projecting portion.

An exemplary embodiment of the present invention provides a mask for manufacturing a thin film transistor substrate, comprising a gate light-shielding portion corresponding to a gate electrode and a gate line of a thin film transistor; and a light-transmitting portion corresponding to a region except the gate light-shielding portion, wherein the gate light-shielding portion includes a body and a projecting portion protruding from the body in a direction of a drain electrode of the thin film transistor. The projecting portion may include first and second projections partially overlapping respectively with both edges of the drain electrode of the thin film transistor.

Exemplary embodiments of the present invention provide a thin film transistor substrate, comprising a plurality of gate lines; a plurality of source lines intersecting the gate lines; pixel electrodes provided in a plurality of pixel regions defined by the gate and source lines; and thin film transistors provided in the pixel regions, each of the thin film transistors including a gate electrode connected to one of the gate lines, a source electrode connected to one of the source lines, and a drain electrode connected to one of the pixel electrodes, wherein the drain electrode includes a drain contact connected to one of the pixel electrodes, and a light-blocking portion provided below the drain contact. The light-blocking portion may be provided on the same plane as the gate electrode.

The source electrode may include first and second protruding portions extending toward both edges of the gate electrode, and a connecting portion for connecting the first and second protruding portions to each other; a portion of the drain electrode extends into a region between the first and second protruding portions; an active layer is exposed in a channel region provided between the source and drain electrodes; and the active layer protrudes outside the channel region by a length corresponding to 30% or less of the width of the source line.

The source electrode may include first and second protruding portions, and a connecting portion for connecting the first and second protruding portions to each other; the first protruding portion may partially overlap with an edge of the gate electrode; and the length of the first protruding portion may be smaller than that of the second protruding portion.

The gate electrode may include a projecting portion formed such that a portion of the gate electrode protrudes in a direction of the drain electrode, and the projecting portion partially overlaps with both edges of the drain electrode. Respective overlapping areas of the drain and source electrodes with the gate electrode may be identical to each other. The active layer may be provided in a region below the source line.

Exemplary embodiments of the present invention provide a method of manufacturing a thin film transistor substrate, comprising the steps of forming a gate electrode, a gate line connected thereto and a light-blocking portion on a substrate; forming a gate insulation film, an active layer and a conductive film on the substrate; and patterning the conductive film and the active layer to form a drain contact and a drain electrode connected to the drain contact on the light-blocking portion and to form a source electrode and a source line.

Exemplary embodiments of, the present invention provide a mask for manufacturing a thin film transistor substrate, comprising a gate light-shielding portion corresponding to a gate electrode and a gate line of a thin film transistor; a drain contact light-shielding portion corresponding to a drain contact connected to a drain electrode of the thin film transistor; and a light-transmitting portion corresponding to a region except the gate light-shielding portion and the drain contact light-shielding portion.

Exemplary embodiments of the present invention provide a thin film transistor substrate, comprising a plurality of gate lines; a plurality of source lines intersecting the gate lines; pixel electrodes provided in a plurality of pixel regions defined by the gate and source lines; and thin film transistors provided in the pixel regions, each of the thin film transistors including a gate electrode connected to one of the gate lines, a source electrode connected to one of the source lines, and a drain electrode connected to one of the pixel electrodes, wherein the source electrode includes first and second protruding portions partially overlapping with the gate electrode, and a connecting portion for connecting them, and an overlapping area of the gate electrode with the first and second protruding portions and the connecting portion is identical to that of the gate electrode with the drain electrode.

The drain electrode partially extends into a region between the first and second protruding portions; an active layer is exposed in a channel region provided between the source and drain electrodes; and the active layer protrudes outside the channel region by a length corresponding to 30% or less of the width of the source line. The first protruding portion may partially overlap with an edge of the gate electrode, and the length of the first protruding portion may be smaller than that of the second protruding portion. The gate electrode may include a projecting portion formed such that a portion of the gate electrode protrudes in a direction of the drain electrode, and the projecting portion may partially overlap with an edge of the drain electrode. The drain electrode may include a drain contact connected to one of the pixel electrodes, and a light-blocking portion provided below the drain contact. The active layer may be provided in a region below the source line.

Exemplary embodiments of the present invention provide a method of manufacturing a thin film transistor substrate, comprising the steps of forming a gate electrode such that the sizes of overlapping areas of the gate electrode respectively with source and drain electrodes are identical to each other, and a gate line connected to the gate electrode on a substrate; forming a gate insulation film, an active layer and a conductive film on the substrate; and patterning the conductive film and the active layer to form the source electrode, a source line connected to the source electrode, and the drain electrode.

Exemplary embodiments of the present invention provide a mask for manufacturing a thin film transistor substrate including a gate electrode, a drain electrode and a source electrode having first and second protruding portions and a connecting portion for connecting them. The mask comprises a gate light-shielding portion corresponding to the gate electrode; and a light-transmitting portion corresponding to a region except the gate light-shielding portion, wherein the gate light-shielding portion is formed such that an overlapping area of the gate electrode with the first and second protruding portions and the connecting portion is identical to that of the gate electrode with the drain electrode of the thin film transistor.

Exemplary embodiments of the present invention provide a mask for manufacturing a thin film transistor substrate, comprising source and drain light-shielding portions corresponding to source electrode and source line regions and a drain electrode region of a thin film transistor, respectively; a translucent portion corresponding to a channel region between the source and drain light-shielding portions; and a light-transmitting portion corresponding to a region except the source electrode region, the source line region, the drain electrode region and the channel region, wherein the source light-shielding portion includes first and second protruding portions and a connecting portion for connecting them, and the width of each of the first and second protruding portions is set to be smaller than that of the drain light-shielding portion so that an overlapping area of the gate electrode of the thin film transistor with the first and second protruding portions and the connecting portion of the source light-shielding portion can be identical to that of the gate electrode with the drain light-shielding portion.

BRIEF DESCRIPTION OF THE DRAWINGS

Exemplary embodiments of the present invention can be understood in detail from the following descriptions taken in conjunction with the accompanying drawings, in which.

DESCRIPTION OF EXEMPLARY EMBODIMENTS

Hereinafter, exemplary embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art.

Figure 1:
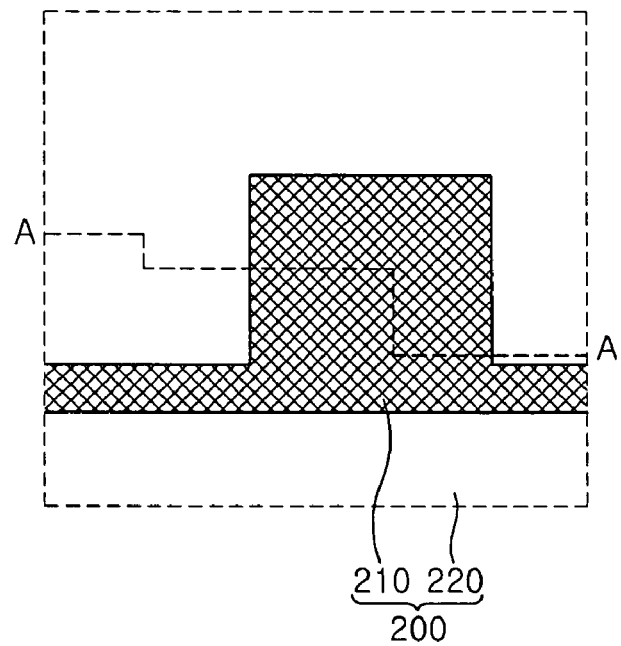
FIG. 1 is a plan view of a mask for forming a gate electrode according to an embodiment of the present invention.
Figure 2:
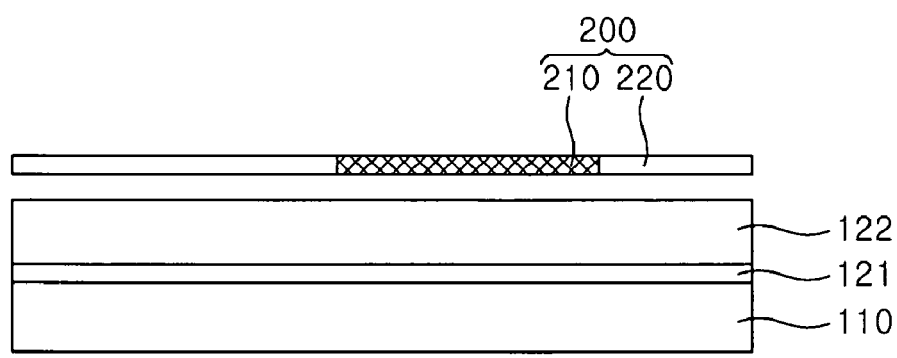
FIGS. 2 to 4 are sectional views taken along line A-A in FIG. 1 to illustrate the formation of the gate electrode according to the exemplary embodiment.
Figure 3:
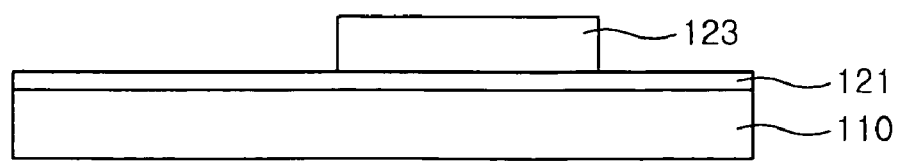
Figure 4:
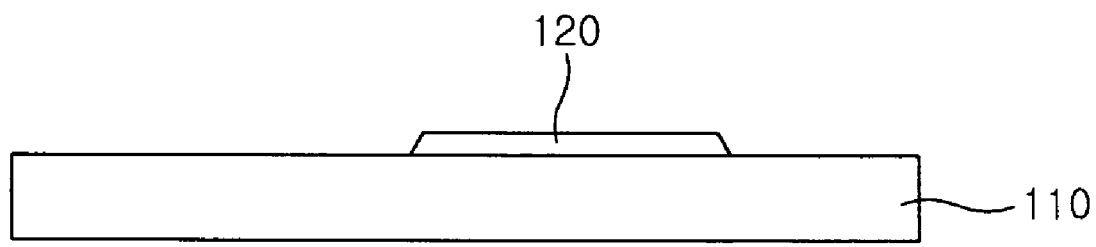
Figure 5:
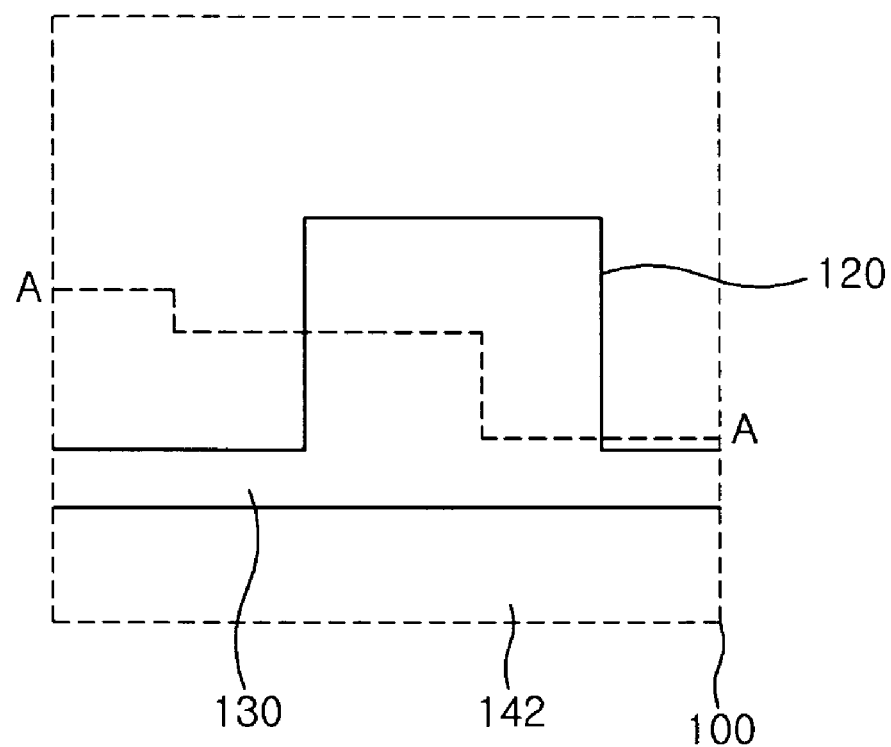
FIG. 5 is a plan view of a substrate on which the gate electrode according to the exemplary embodiment is formed.

FIG. 1 is a plan view of a mask for forming a gate electrode according to an embodiment of the present invention, FIGS. 2 to 4 are sectional views taken along line A-A in FIG. 1 to illustrate the formation of the gate electrode, and FIG. 5 is a plan view of a substrate on which the gate electrode is formed.

The formation of the gate electrode will be described below with reference to FIGS. 1 to 5. As shown in FIG. 2, a first conductive film 121 is first formed on a transparent insulative substrate 110, and a first photosensitive film 122 is then applied thereon. The photosensitive film 122, i.e., photo resist film, is changed in a property thereof according to light. At this time, the first conductive film 121 is formed through a deposition method using CVD, PVD, sputtering or the like. It is preferred that at least any one of Cr, MoW, Cr/Al, Cu, Al(Nd), Mo/Al, Mo/Al(Nd) and Cr/Al(Nd) be used for the first conductive film 121.

Preferably, as shown in FIG. 2, a first mask 200 for forming a gate electrode is aligned on the substrate 110 on which the first conductive film 121 and the first photosensitive film 122 are applied. Then, light exposing and developing processes are performed using the first mask 200 so that a first photosensitive mask pattern 123 for opening a region of the first photosensitive film 122 except a gate electrode region is formed as shown in FIG. 3.

As shown in FIG. 1, the first mask 200 for forming a gate electrode comprises a light-shielding portion 210 for shielding light in gate line and gate electrode regions, and a light-transmitting portion 220 through which light in a region except the gate line and gate electrode regions is transmitted. At this time, the regions of the light-shielding portion 210 and the light-transmitting portion 220 may be changed depending on properties of the first photosensitive film 122 formed on the transparent insulative substrate 110. In this embodiment, it is advantageous that the gate electrode region is provided in the form of a rectangle protruding at one side of a gate line. The first mask 200 with the aforementioned structure is aligned on the substrate 110, and light exposing and developing processes are then performed so that the first photosensitive mask pattern 123 is formed on the first conductive film 121. It is preferred that the first photosensitive mask pattern 123 be provided in the pattern corresponding to the light-shielding portion 210 shown in FIG. 1.

Preferably, the first photosensitive mask pattern 123 is cured through a predetermined baking process, and an etching process is then performed using the cured, first photosensitive mask pattern as an etching mask to remove the first conductive film 121 such that a gate electrode 120 and a gate line 130 are formed as shown in FIGS. 4 and 5. It is preferred that the first photosensitive mask pattern 123 be removed through a predetermined stripping process after the gate electrode 120 has been formed.

Figure 6:
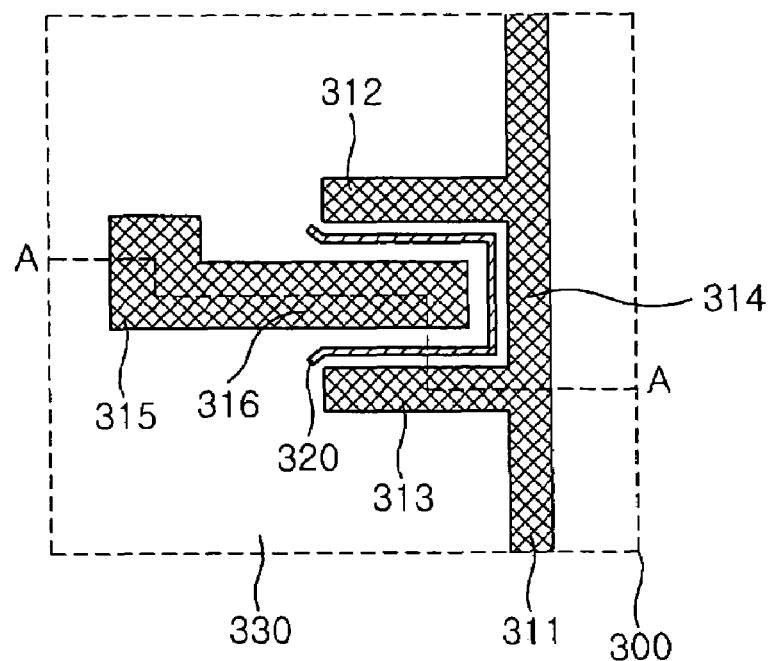
FIG. 6 is a plan view of a mask for forming source and drain electrodes according to the exemplary embodiment.
Figure 9:
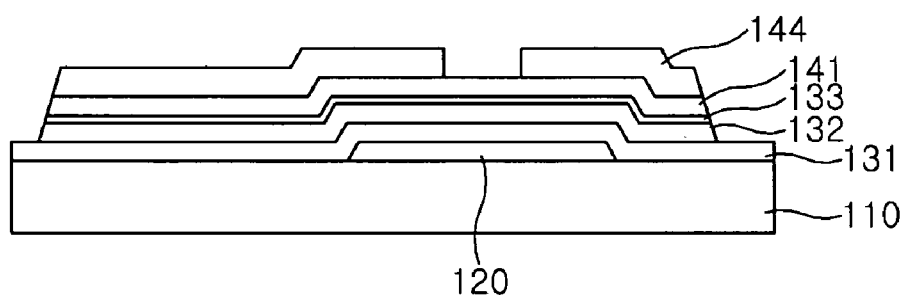
Figure 10:
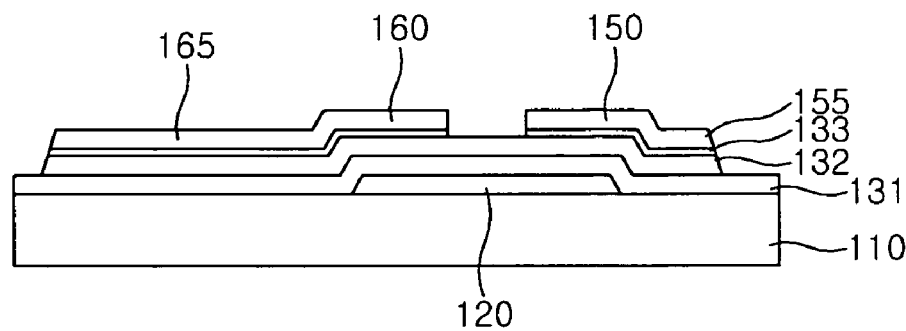
Figure 11:
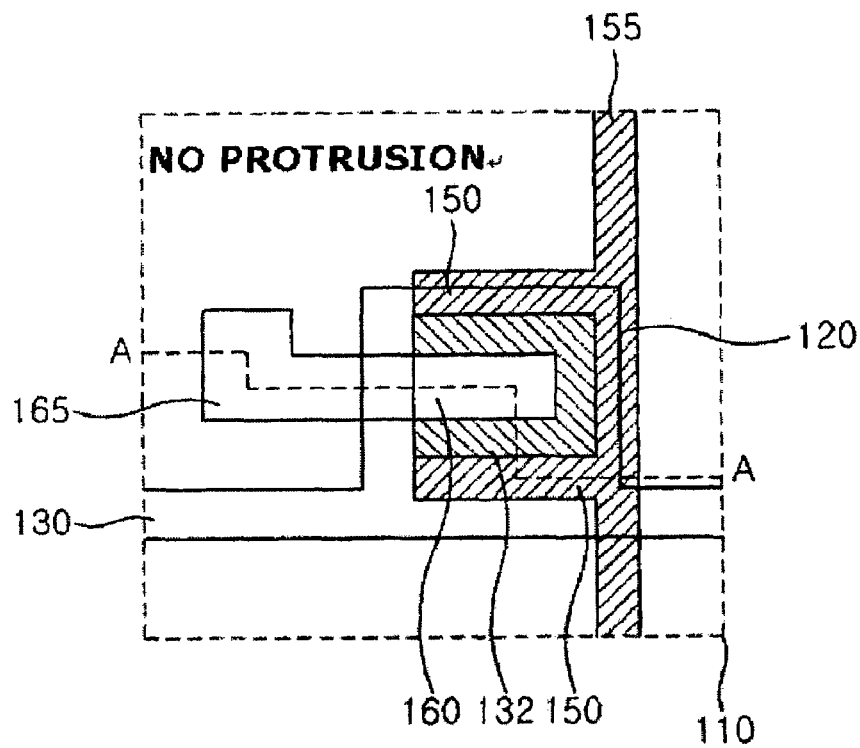
FIG. 11 is a plan view of a substrate on which the source and drain electrodes according to the exemplary embodiment are formed.

FIG. 6 is a plan view of a mask for forming source and drain electrodes according to an exemplary embodiment, FIGS. 7 to 10 are sectional views taken along line A-A in FIG. 6 to illustrate the formation of the source and drain electrodes, and FIG. 11 is a plan view of a substrate on which the source and drain electrodes are formed.

Figure 7:
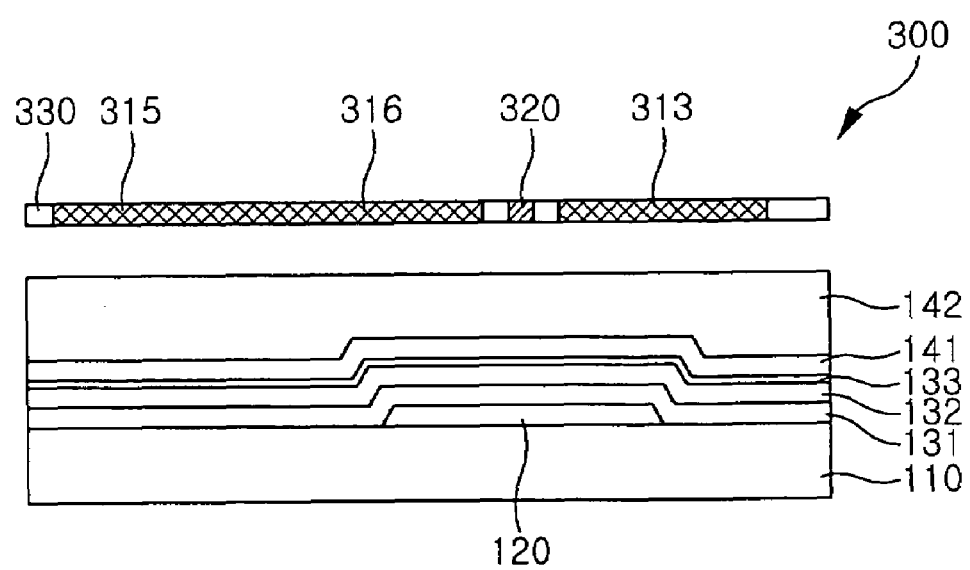
FIGS. 7 to 10 are sectional views taken along line A-A in FIG. 6 to illustrate the formation of the source and drain electrodes according to the exemplary embodiment.

The formation of the source and drain electrodes will be described below with reference to FIGS. 6 to 11. Referring to FIG. 7, a gate insulation film 131 is first formed on the substrate 110, on which the gate electrode 120 and the gate line 130 have been formed, through a deposition method using PECVD, sputtering or the like, as shown in FIG. 5, which has been previously described. At this time, it is preferred that an inorganic insulating substance including silicone oxide or silicone nitride be used for the gate insulation film 131. An active layer 132, an ohmic contact layer 133 and a second conductive film 141 are sequentially formed on the gate insulation film 131 through the deposition method. It is preferred that an amorphous silicone layer be used as the active layer 132, a silicide or an amorphous silicone layer doped with a high concentration of N-type dopant be used as the ohmic contact layer 133, and a single- or multi-layered film made of at least one metal of Mo, Al, Cr and Ti be used as the second conductive film 141. In this embodiment, it is advantageous that a thin film with a Mo/Al/Mo structure is used as the second conductive film 141. It will be apparent that the same substance as the first conductive film 121 may be used for the second conductive film 141. A second photosensitive film 142 is applied to the second conductive film 141.

Figure 8:
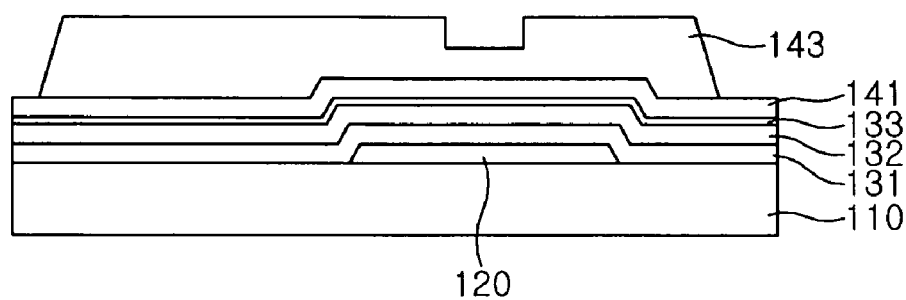

Thereafter, preferably, a second mask 300 for forming source and drain electrodes, a source line and a channel region shown in FIG. 6 is aligned on the substrate 110 on which the second photosensitive film 142 has been applied, and light exposure is then performed using the second mask 300 to form a second photosensitive mask pattern 143 that opens a region of the second photosensitive film 142 except source/drain electrodes, source line and channel regions and has a predetermined step in the channel region as shown in FIG. 8.

As shown in FIG. 6, the second mask 300 comprises light-shielding portions 311, 312, 313, 314, 315 and 316 for shielding the source and drain electrode regions; a translucent portion 320 provided in the channel region between the source and drain electrodes; and a light-transmitting portion 330 provided in a region except the source electrode region, source line region, the drain electrode region and the channel region.

It is preferred that the light-shielding portions include source light-shielding portions 311, 312, 313 and 314, and drain light-shielding portions 315 and 316. It is preferred that the light-shielding portions be made of a substance such as Cr capable of preventing light transmission.

The source light-shielding portions 311, 312, 313 and 314 comprise a source line light-shielding portion 311 for shielding a source line region perpendicular to the gate line 130, and source electrode light-shielding portions 312, 313 and 314 for shielding a source electrode region that extends from a source line to the gate electrode 120 and has a predetermined concave portion. The source electrode light-shielding portions 312, 313 and 314 comprise first and second protruding portions 312 and 313 which protrude from the source line light-shielding portion 311, and a connecting portion 314 for connecting the protruding portions 312 and 313 to each other. At this time, it is preferred that the connecting portion 314 be connected to another connecting portion 314 of adjacent source electrode light-shielding portions 312, 313 and 314 via the source line light-shielding portion 311.

The drain light-shielding portions 315 and 316 comprise a drain contact light-shielding portion 315 for shielding a drain contact region provided in a pixel region to be connected to a pixel electrode, and a drain electrode light-shielding portion 316 for shielding a drain electrode region of which a portion extends from a drain contact to the inside of the concave portion of the source electrode. At this time, the drain electrode light-shielding portion 316 extends parallel to the first and second protruding portions 312 and 313 but perpendicularly to the connecting portion 314. It is preferred that the translucent portion 320 be provided in a neighboring region between the source electrode light-shielding portions 312, 313 and 314 and the drain electrode light-shielding portion 316. It is preferred that the translucent portion 320 be formed by performing slit or half-tone treatment.

In this embodiment, the drain electrode light-shielding portion 316 partially extends into the concave portion provided by the first and second protruding portions of the source electrode light-shielding portions 312, 313 and the connecting portion 314. It is preferred that the translucent portion 320 be formed between the first and second electrodes 312 and 313 and the drain electrode light-shielding portion 316, and between the connecting portion 314 and the drain electrode light-shielding portion 316. It is preferred that the translucent portion 320 be manufactured in the form of an angled line bent along the inside of the concave portion. Further, as shown in this figure, both ends of the angled line-shaped translucent portion 320 are bent toward the first and second protruding portions 312 and 313, respectively, thereby preventing a phenomenon in which light is introduced into the concave portion upon exposure to light. It is preferred that the ends of the translucent portion be bent within a region where they are not out of a width range of the concave portion. The translucent portion 320 protrudes outside the channel region by a length corresponding to 30% or less of the width of the source line region.

In this embodiment described above, the drain electrode light-shielding portion 316 is partially surrounded the source electrode light-shielding portions 312, 313 and 314, respectively, and the channel region is formed by the translucent portion 320 provided therebetween, thereby providing a channel region with a sufficient length.

Further, the translucent portion 320 is provided inside the region of the concave portion where the drain electrode light-shielding portion 316 and the source electrode light-shielding portions 312, 313 and 314 are adjacent to each other, thereby preventing a phenomenon in which the channel region expands to a region except the region where the source and drain electrodes 150 and 160 are adjacent to each other. Accordingly, this reduces an area in which electrons can move, resulting in a reduced off current.

Further, in a case where light is incident, there may be caused a phenomenon in which while electron carriers induced by photons are being trapped inside the active layer, the trapped electron carriers are injected into a conduction band by means of a voltage difference between the drain and source electrodes when a TFT is off. Thus, the expansion of the channel region is prevented in this embodiment, so that an off current induced by light irradiated in an edge region of the gate electrode, particularly, onto a region between the gate electrode and the drain contact can be minimized.

Further, the expansion of the channel region is prevented so that a mean free path of an electron can be extended, thereby reducing the off current.

If the second mask 300 with the aforementioned structure is aligned on the substrate 110 on which the second photosensitive film 142 is applied on the second conductive film 141, and light exposure is then performed, light is transmitted through the light-transmitting portion 330 so that the second photosensitive film 142 formed therebelow is exposed to the light and subjected to a change in its chemical property. However, the region of the second photosensitive film 142 corresponding to the light-shielding portion 310 is not exposed to the light so that its chemical property cannot be changed. Further, the light is only partially transmitted through the translucent portion 320, so that an upper section of the second photosensitive film 142 can be only partially exposed to the light. Accordingly, a chemical property of the upper section of the second photosensitive film 142 is changed. Thereafter, when the second mask 300 is removed from the substrate 110 and a predetermined developing process is then performed, as shown in FIG. 8, a portion of the photosensitive film formed below the light-transmitting portion 330 with the changed chemical property is removed, a portion of the photosensitive film formed below the light-shielding portions is not removed, and a portion of the photosensitive film formed below the translucent portion 320 has a height lower than that of the photosensitive film formed below the light-shielding portions. Thereafter, a baking process is performed to cure the patterned, second photosensitive film 142, thereby forming the second photosensitive mask pattern 143 with a step. The second photosensitive mask pattern 143 with the step may be manufactured using a translucent mask with the aforementioned translucent portion 320 or may be formed using a diffraction exposure mask with a diffraction exposure portion.

An etching process is performed using the second photosensitive mask pattern 143 as an etching mask so as to sequentially remove the second conductive film 141, the ohmic contact layer 133 and the active layer 132. Preferably, in the etching process, wet etching is first performed to remove the second conductive film 141, and dry etching is then performed to remove the ohmic contact layer 133 and the active layer 132.

Thereafter, the entire height of the second photosensitive mask pattern 143 is lowered to form the second photosensitive mask pattern 144 having a structure in which the step region, i.e., the channel region is exposed as shown in FIG. 9. At this time, the entire height of the second photosensitive mask pattern 143 may be lowered through a stripping process using a wet chemical solution or through an ashing process using $O_2$ plasma.

An etching process is performed using the second photosensitive mask pattern 144 with the exposed, channel region as an etching mask so as to remove the second conductive film 141 and the ohmic contact layer 133 in the channel region, and a predetermined stripping process is then performed to remove the remainder of the second photosensitive mask pattern 144. Accordingly, a source electrode 150, a source line 155, a drain electrode 160 and a drain contact 165 are formed, and a channel region composed of the active layer 132 is formed between the source and drain electrodes 150 and 160 as shown in FIG. 10. Accordingly, it is possible to fabricate a TFT in which the source and drain electrodes 150 and 160 are formed above the gate electrode 120 and the active layer is provided in a region between the source and drain electrodes 150 and 160 adjacent to each other.

At this time, the source and drain electrodes 150 and 160 are manufactured in the pattern corresponding to the aforementioned light-shielding portions of the second mask 300, and the active layer 132 is also exposed at the region between the source and drain electrodes 150 and 160.

Accordingly, it is preferred that the channel region including the active layer 132 be provided at the region between the source and drain electrodes 150 and 160 adjacent to each other, and the width of a portion of the active layer 132 protruding outside the defined channel region be 30% or less with respect to that of the source line 155.

More preferably, the channel region does not protrude with respect to the end of the source electrode 150. Although such a protrusion range of the active layer may be changed due to not only margins of processes such as light exposing, developing or etching processes but also factors such as the aforementioned bent shape of the end of the translucent portion 320 in the mask of FIG. 6, it is preferred that the maximum width of the protruding portion be a length corresponding to 30% or less of that of the source line 155.

This means that since the active layer and the conductive film for a source electrode and a source line are patterned when a TFT substrate is manufactured using four sheets of masks described in this embodiment, the active layer may be partially exposed to a side of the source line. Further, the width of the portion of the active layer exposed at this time is adjusted to be not greater than 30% of that of the source line, thereby securing a process margin.

Here, the off current refers to a phenomenon in which that electrons of the drain contact region flow to the source electrode 150 through the active layer 132 when the TFT is in an off state. At this time, if a portion of the active layer 132 protrudes outside the defined channel region to have a width of 30% or more with respect to that of the source line 155, the electrons can easily move by means of the protruding portion, resulting in an increased off current. However, the optimization of the protruding portion of the active layer in this embodiment reduces a space where the electrons can move and increases the moving distance of the electrons, thereby minimizing the off current and improving a residual image phenomenon.

Figure 12:
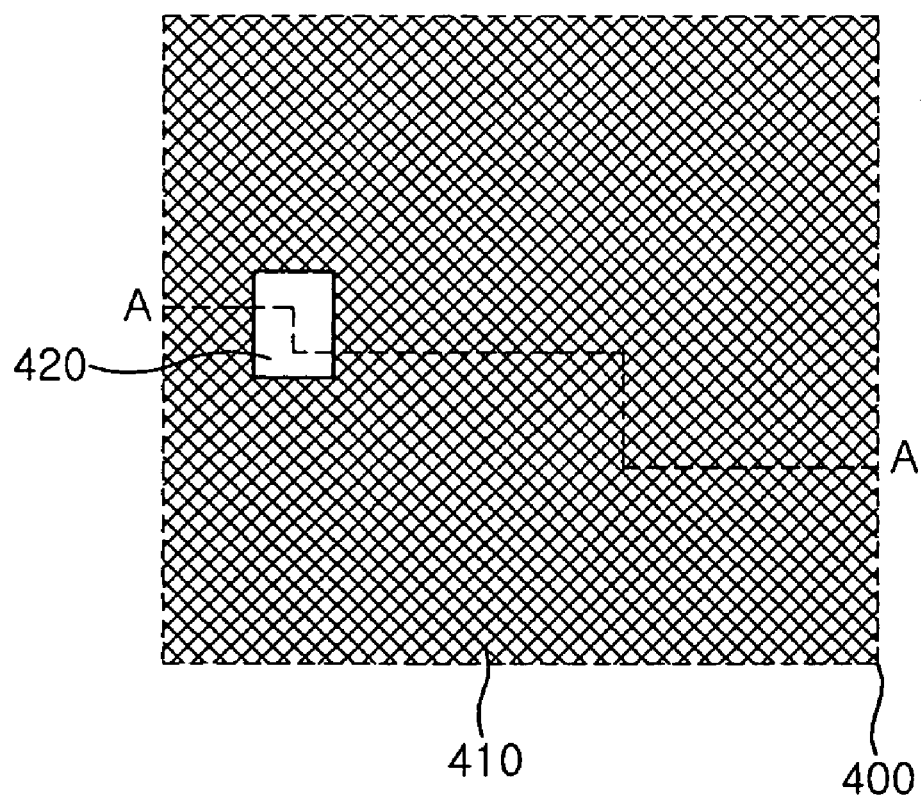
FIG. 12 is a plan view of a mask for forming a drain contact according to the exemplary embodiment.
Figure 13:
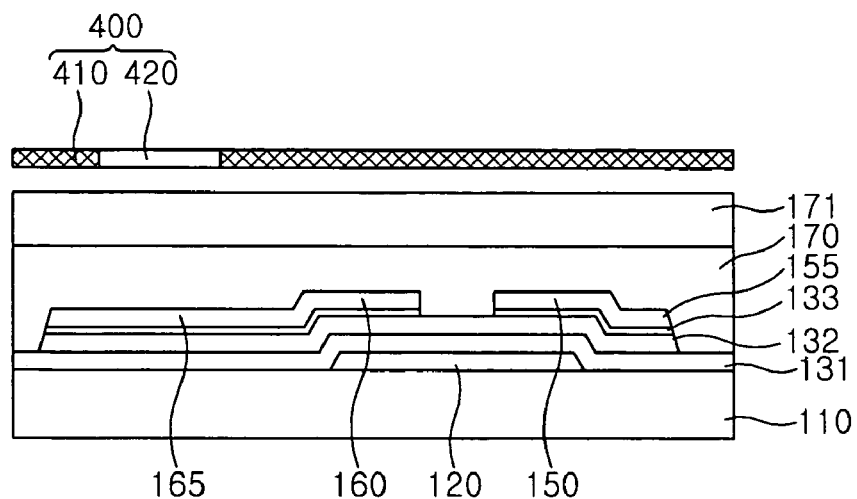
FIGS. 13 to 15 are sectional views taken along line A-A in FIG. 12 to illustrate the formation of the drain contact according to the exemplary embodiment.
Figure 14:
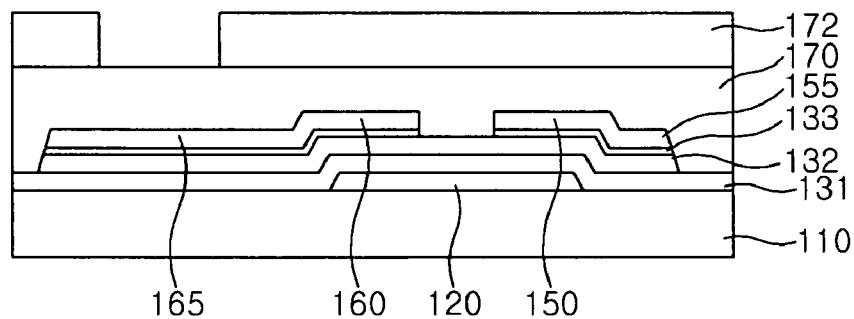
Figure 15:
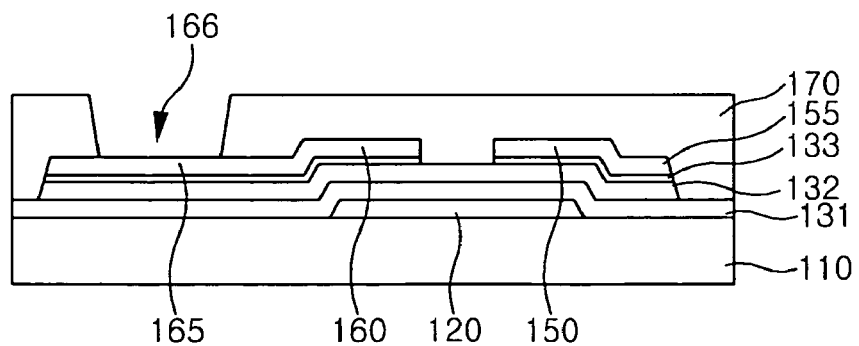
Figure 16:
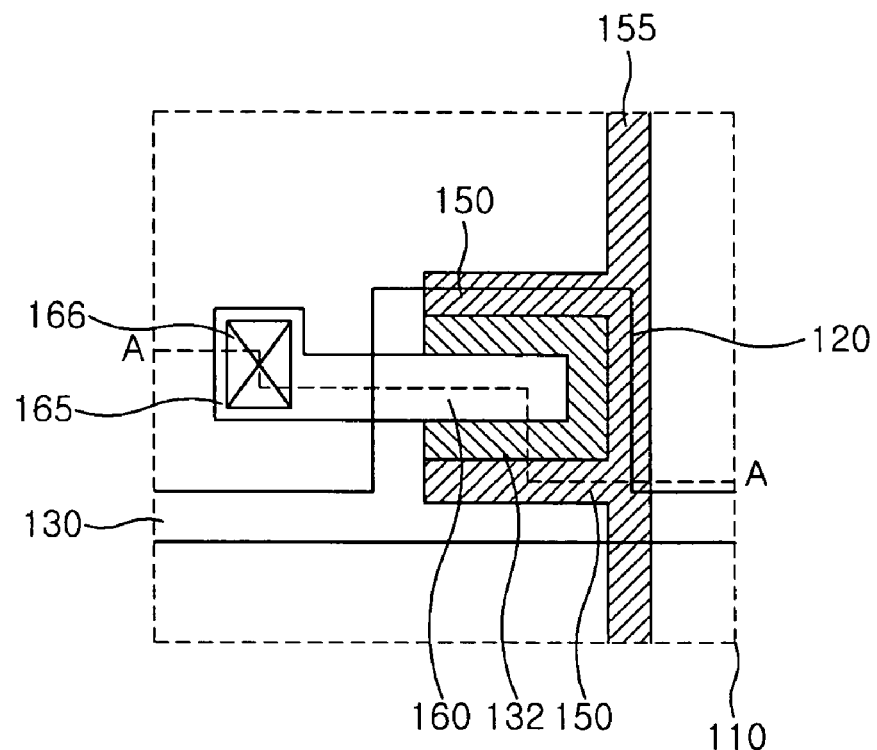
FIG. 16 is a plan view of a substrate on which the drain contact according to the exemplary embodiment is formed.

FIG. 12 is a plan view of a mask for forming a drain contact according to the above-described embodiment, FIGS. 13 to 15 are sectional views taken along line A-A in FIG. 12 to illustrate the formation of the drain contact, and FIG. 16 is a plan view of a substrate on which the drain contact is formed.

The formation of the drain contact will be described below with reference to FIGS. 12 to 16. Referring to FIG. 13, a protection film 170 is formed on the transparent insulative substrate 110 provided with the TFT as shown in FIG. 11, and a third photosensitive film 171 is applied to the top of the protection film. An organic or inorganic insulation film may be used as the protection film 170, and it is preferred that a silicone nitride or silicone oxide film be used in this exemplary embodiment.

Preferably, as shown in FIG. 13, the third mask 400 for forming a drain contact shown in FIG. 12 is aligned on the substrate 110 to which the third photosensitive film 171 is applied, and light exposing and developing processes are then performed to form a third photosensitive mask pattern 172 for opening a drain contact region as shown in FIG. 14. The third mask 400 shown in FIG. 12 comprises a light-transmitting portion 420 for transmitting light therethrough in the drain contact region, and a light-shielding portion 410 for shielding light in a region except the drain contact region. It is advantageous that if light exposure is performed using the third mask 400 with the aforementioned structure, a chemical property of a light-exposed region of the third photosensitive film 171 is changed, and the region of the third photosensitive film 171 with the changed chemical property is removed through a developing process and then cured through a baking process to form the third photosensitive mask pattern 172 as shown in FIG. 14.

Thereafter, it is preferred that an etching process be performed using the third photosensitive mask pattern 172 as an etching mask to remove the protection film 170 so that a drain contact hole 166 for exposing a lower drain contact 165 can be formed as shown in FIG. 15. Then, it is preferred that the third photosensitive mask pattern 172 be removed through a predetermined stripping process.

Figure 17:
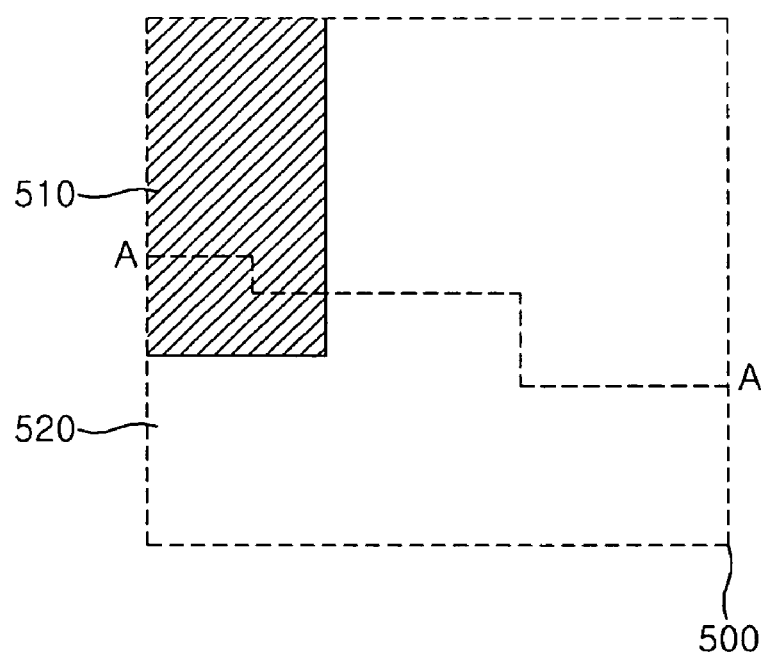
FIG. 17 is a plan view of a mask for forming a pixel electrode according to the exemplary embodiment.
Figure 18:
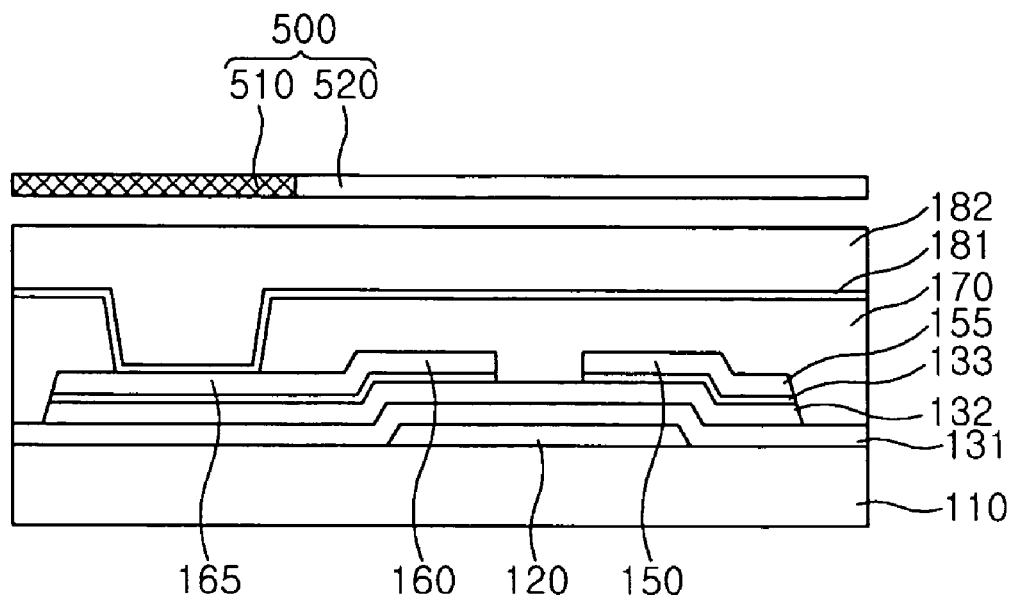
FIGS. 18 and 19 are sectional views taken along line A-A in FIG. 17 to illustrate the formation of the pixel electrode according to the exemplary embodiment.
Figure 19:
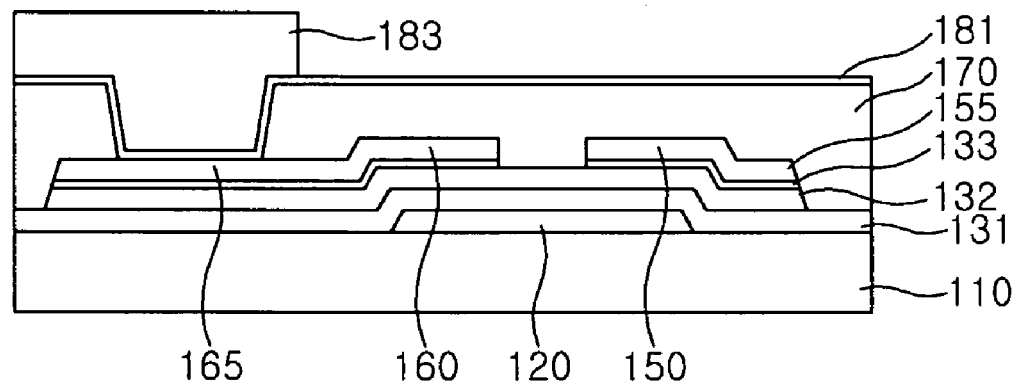
Figure 20:
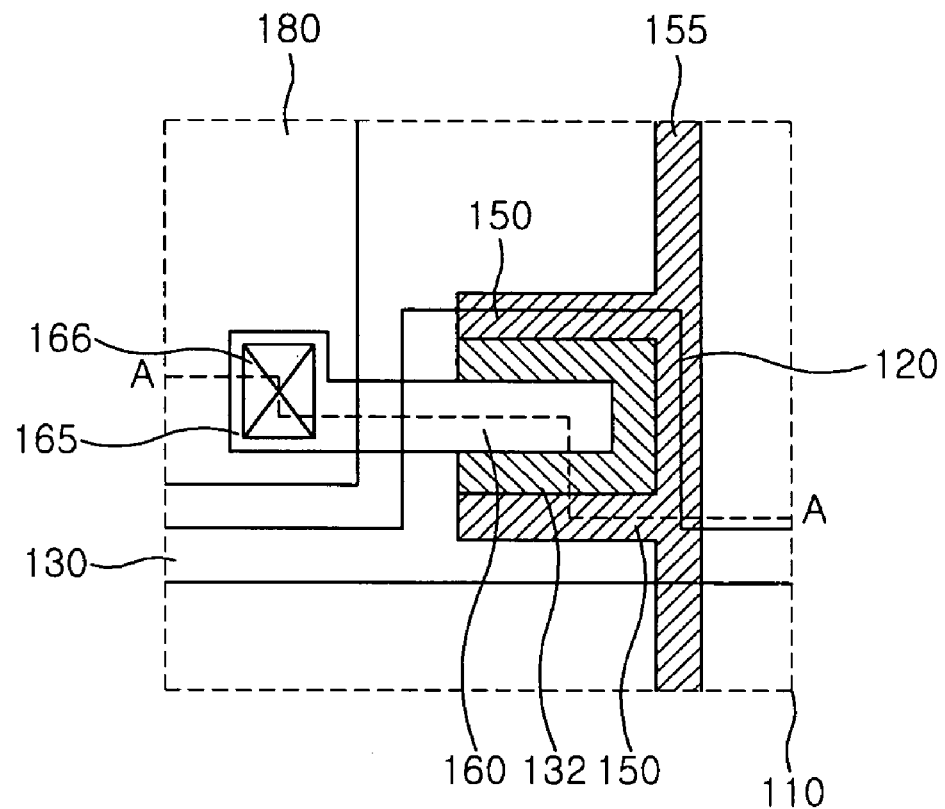
FIG. 20 is a plan view of a thin film transistor (TFT) region of a liquid crystal display (LCD) according to the exemplary embodiment.
Figure 21:
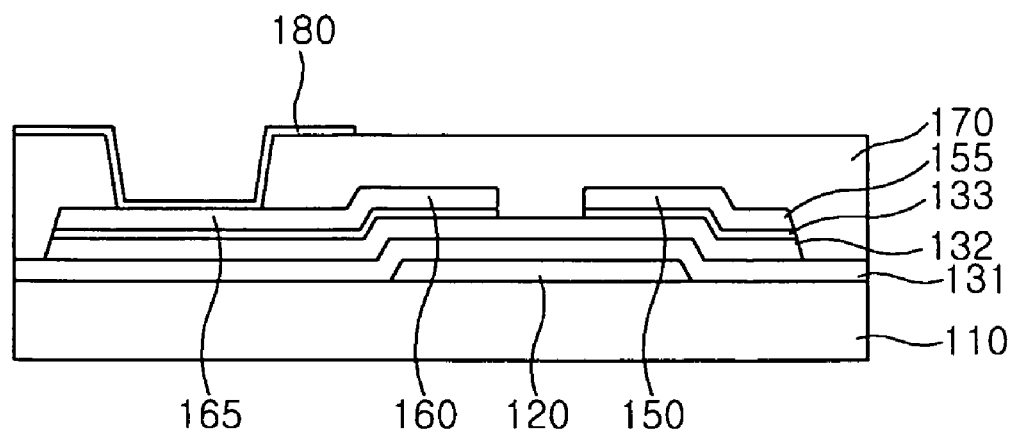
FIG. 21 is a sectional view taken along line A-A in FIG. 20.

FIG. 17 is a plan view of a mask for forming a pixel electrode according to the above-described embodiment, FIGS. 18 and 19 are sectional views taken along line A-A in FIG. 17 to illustrate the formation of the pixel electrode, FIG. 20 is a plan view of a thin film transistor (TFT) region of a liquid crystal display (LCD), and FIG. 21 is a sectional view taken along line A-A in FIG. 20.

The formation of the pixel electrode will be described below with reference to FIGS. 17 to 21. Referring to FIG. 18, a third conductive film 181 for a pixel electrode is first formed on the protection film 170 provided with the drain contact hole 166 as shown in FIG. 16, and a fourth photosensitive film 182 is applied to the top of the third conductive film 181. At this time, it is preferred that indium tin oxide (ITO) or indium zinc oxide (IZO), which is a transparent conductive material, be used as the third conductive film 181.

Thereafter, it is preferred that the fourth mask 500 for forming a pixel electrode shown in FIG. 17 be aligned on the substrate 110 to which the fourth photosensitive film 182 is applied, and light exposure be then performed to form a fourth photosensitive mask pattern 183 for opening a region except a pixel electrode region as shown in FIG. 19. The fourth mask 500 shown in FIG. 17 comprises a light-shielding portion 510 for shielding the introduction of light into the pixel electrode region, and a light-transmitting portion 520 for transmitting light therethrough in a region except the pixel electrode region. If light exposure is performed using the aforementioned fourth mask 500, a chemical property of a light-exposed region of the fourth photosensitive film 182 is changed. Thereafter, if a developing process is performed, the light-exposed region of the fourth photosensitive film 182 is removed. If a baking process is performed, the fourth photosensitive mask pattern 183 is preferably formed as shown in FIG. 19.

Thereafter, an etching process is performed using the fourth photosensitive mask pattern 183 as an etching mask to remove the fourth conductive film 181, and the fourth photosensitive mask pattern 183 is then removed through a predetermined stripping process. Accordingly, a TFT substrate for an LCD with a pixel electrode 180 connected to the drain electrode 160 of the TFT is fabricated as shown in FIGS. 20 and 21.

Thereafter, a common electrode substrate provided with a color filter and a common electrode and the TFT substrate are joined and sealed together, and a liquid crystal layer is injected therebetween to manufacture a panel for an LCD.

As described above, the optimization of the exposed portion of the active layer between the source and drain electrodes in the TFT of this embodiment minimizes the area in which electrons can move, between the source and drain electrodes through which leakage is generated, minimizes an electron trapping phenomenon caused by light, and reduces an off current through the increase in the area in which electrons can move.

Further, the present invention is not limited to the foregoing and the length of the first protruding portion of the source electrode may be set to be smaller than that of the second protruding portion so as to minimize an off current induced due to an electron trapping phenomenon by light in the edge region of the gate electrode. A method of manufacturing an LCD having a TFT according to an exemplary embodiment of the present invention, in which the length of the first protruding portion of the source electrode is smaller than that of the second protruding portion, will be described below. Hereinafter, a description overlapping with the foregoing will be omitted.

Figure 22:
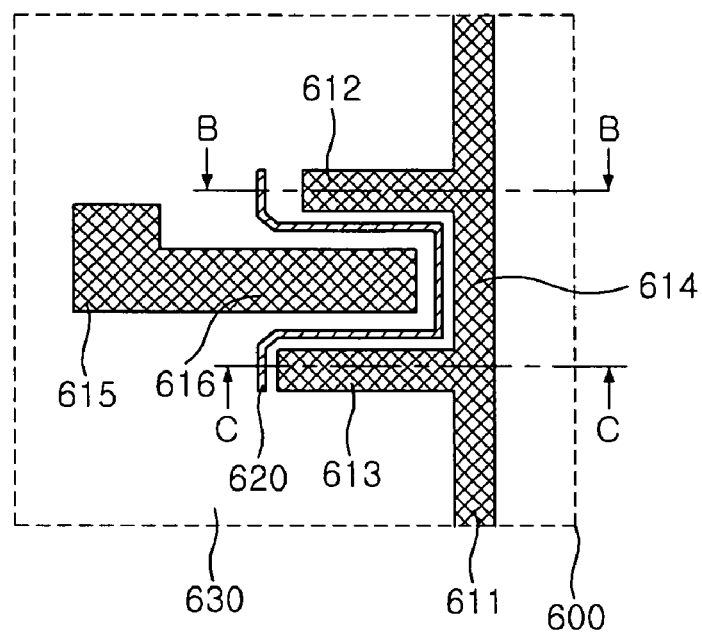
FIG. 22 is a plan view of a mask for forming source and drain electrodes according to an exemplary embodiment.
Figure 23:
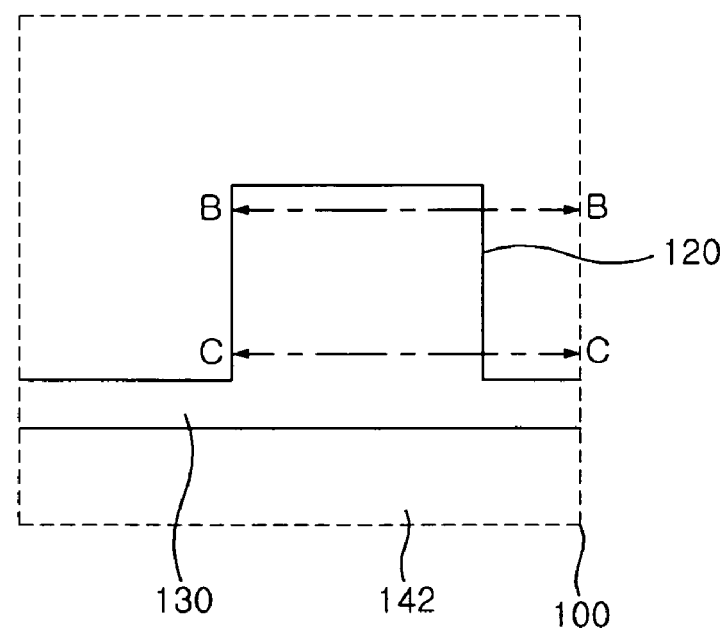
FIG. 23 is a plan view of a substrate on which an active layer and a conductive film for source and drain electrodes according to the exemplary embodiment.
Figure 27:
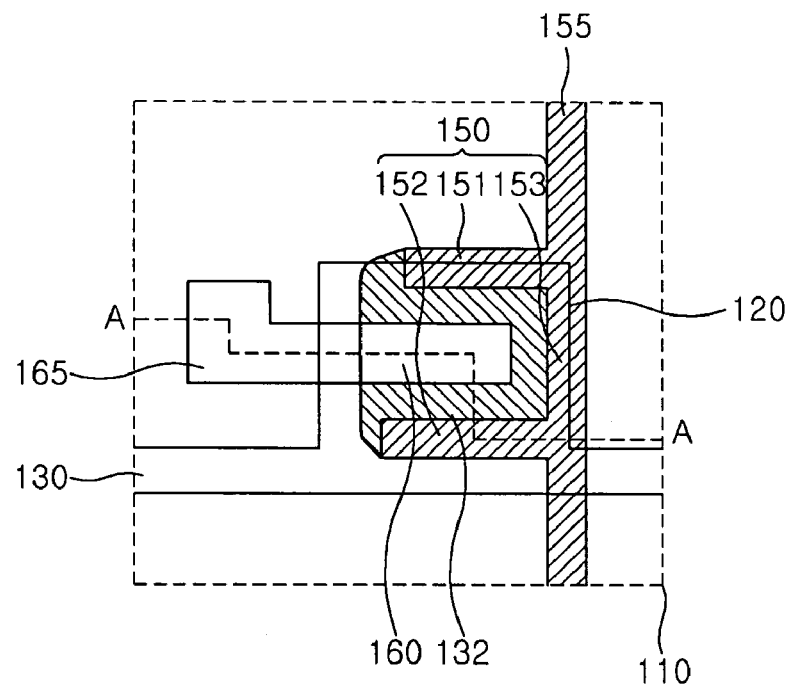
FIG. 27 is a plan view of a TFT region of an LCD according to the exemplary embodiment.
Figure 28:
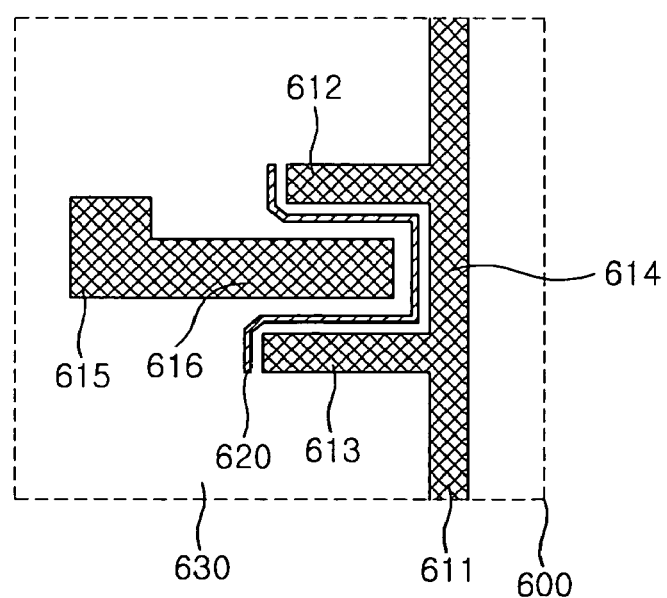
FIG. 28 is a plan view of a mask for forming source and drain electrodes according to a variant of an exemplary embodiment.

FIG. 22 is a plan view of a mask for forming source and drain electrodes according to an exemplary embodiment, FIG. 23 is a plan view of a substrate on which an active layer and a conductive film for source and drain electrodes are formed, FIGS. 24(a), 25(a) and 26(a) are sectional views taken along lines B-B in FIGS. 22 and 23, FIGS. 24(b), 25(b)

and 26(*b*) are sectional views taken along lines C-C in FIGS. 22 and 23, FIG. 27 is a plan view of a TFT region of an LCD according to the exemplary embodiment, and FIG. 28 is a plan view of a mask for forming source and drain electrodes according to an embodiment of the present invention.

Referring to FIGS. 22 to 28, a gate electrode 120 and a gate line 130 are formed on a substrate 110, and a gate insulation film 131, an active layer 132, an ohmic contact layer 133 and a second conductive film 141 are sequentially formed thereon as described in the previous embodiment. Preferably, a second photosensitive film 142 is applied to the second conductive film 141, a mask 600 for forming source and drain electrodes and a channel region according to this embodiment is then aligned thereon, and light exposing and developing processes are performed to form a second photosensitive mask pattern 143 that opens a region of the second photosensitive film 142 except source/drain electrode regions and a channel region and has a predetermined step in the channel region.

As shown in FIG. 22, the mask 600 for forming source and drain electrodes according to this embodiment comprises a light-shielding portions 611, 612, 613, 614, 615 and 616 including source light-shielding portions 611, 612, 613 and 614 and drain light-shielding portions 615 and 616, a translucent portion 620 provided in the channel region, and a light-transmitting portion 630 provided in the region except the source and drain electrode regions and the channel region.

The source light-shielding portions 611, 612, 613 and 614 comprise a source line light-shielding portion 611 for shielding a source line region perpendicular to the gate line 130, a first protruding portion 612 extending from the source line light-shielding portion 611 to an upper edge region of the gate electrode 120, a second protruding portion 613 protruding from the source line light-shielding portion 611 to a lower inner region of the gate electrode 120, and a connecting portion 614 for connecting the protruding portions 612 and 613 to each other. In this embodiment, it is preferred that the length of the first protruding portion 612 be set to be smaller than that of the second protruding portion 613. The length of the first protruding portion 612 of the source light-shielding portions 611, 612, 613 and 614 is set to be smaller in this manner, so that the length of a first protruding portion 151 of a source electrode 150 overlapping with one edge of the gate electrode 120 can be set to be short as shown in FIG. 27. Accordingly, it is possible to prevent an increase in an off current induced at an outer edge of the gate electrode 120 due to an electron trapping phenomenon caused by light. At this time, it is preferred that the length of the first protruding portion 612 of the source light-shielding portions 611, 612, 613 and 614 be set to be smaller by 0.1 to 3 μm than that of the second protruding portion 613.

The drain light-shielding portions 615 and 616 comprise a drain contact light-shielding portion 615 and a drain electrode light-shielding portion 616 of which a portion extends into a concave region formed by the first and second protruding portions 612 and 613 and the connecting portion 614 of the source electrode light-shielding portions 611, 612, 613 and 614 from the drain contact light-shielding portion 615.

Preferably, the translucent portion 620 is provided in the form of a bent line in a neighboring region between the drain electrode light-shielding portion 616 and the source electrode light-shielding portions 611, 612, 613 and 614, and both ends of the translucent portion 620 extend toward the first and second protruding portions 612 and 613 of the source electrode light-shielding portions 611, 612, 613 and 614, respectively. As such, the translucent portion 620 is provided between the drain electrode light-shielding portion 616 and the source electrode light-shielding portions 611, 612, 613 and 614 to form a channel region therebetween, and both ends of the translucent portion 620 extend toward the first and second protruding portions 612 and 613, thereby preventing a phenomenon in which light exposed in a pixel region with a low pattern density penetrates into the channel region.

Figure 24:
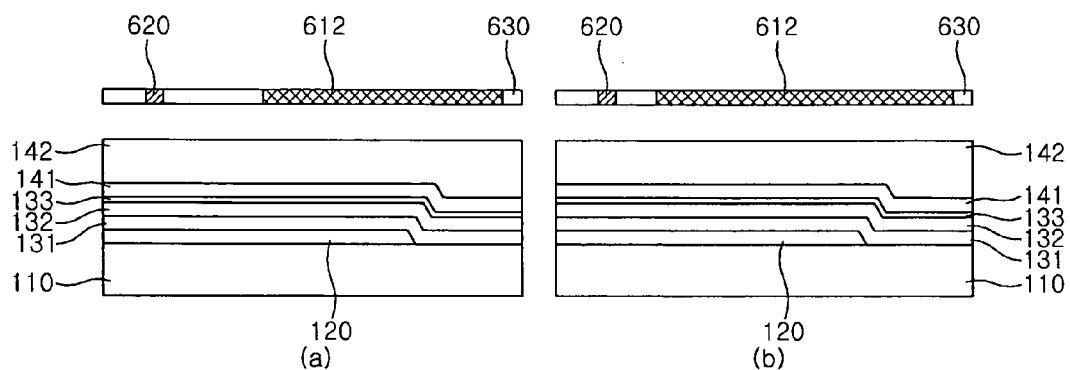
FIGS. 24(a), 25(a) and 26(a) are sectional views taken along lines B-B in FIGS. 22 and 23, and FIGS. 24(b), 25(b) and 26(b) are sectional views taken along lines C-C in FIGS. 22 and 23.

In this embodiment, distances between the extending outer ends of the translucent portion 620 and the first and second protruding portions 612 and 613 may be set to be different from each other as shown in FIGS. 22 and 24, or to be identical with each other as in the variant of FIG. 28. This is not only because only the length of the first protruding portion 612 is changed to adjust the moving space and distance of electrons but also because the lengths of both the translucent portion 620 and the first protruding portion 612 are changed to adjust the moving space and distance of electrons.

Figure 25:
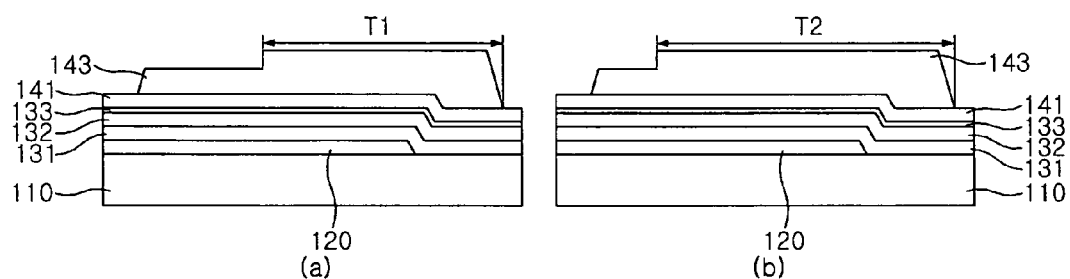

As shown in FIG. 24, the mask 600 with the aforementioned structure is aligned on the substrate 110. Thereafter, light exposure is performed, the mask 600 is removed, and a developing process is then performed to form the photosensitive mask pattern 143 with a step as shown in FIG. 25. At this time, it can be seen in this figure that the length Ti of the photosensitive mask pattern 143 corresponding to the first protruding portion 612 is smaller than the length T2 of the photosensitive mask pattern 143 corresponding to the second protruding portion 613.

Figure 26:
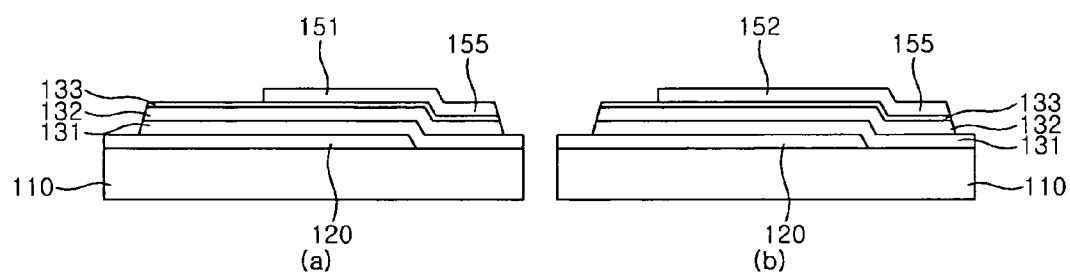

As shown in, FIG. 26, exposed portions of the second conductive film 141, ohmic contact layer 133 and active layer 132 are sequentially removed using the photosensitive mask pattern 143 as an etching mask. Preferably, the height of the photosensitive mask pattern 143 is lowered, and the second conductive film 141 and the ohmic contact layer 133 is then removed using the photosensitive mask pattern so as to form a source electrode 150, which has first and second protruding portions 151 and 152 extending to be spaced apart from each other above the gate electrode 120 and a connecting portion 153 for connecting the first and second protruding portions, a source line 155 connected to the source electrode 150, a drain contact 165 formed in the pixel region, and a drain electrode 160 extending into a region between the first and second protruding portions 151 and 152 of the source electrode 150 as shown in FIG. 27. Further, it is preferred that a portion of the active layer 132 be exposed between the source and drain electrodes 150 and 160 to function as a channel region of the TFT.

Preferably, the TFT fabricated described above comprises the gate electrode 120 patterned in a generally rectangular shape; the source electrode 150 with the first and second protruding portions 151 and 152 extending in a direction of two opposing portions of the gate electrode 120 and a connecting portion 153 for connecting the first and second protruding portions 151 and 152 to each other; and the drain electrode 160 extending to a region between the first and second protruding portions 151 and 152. The length of the first protruding portion 151 is preferably set to be smaller than that of the second protruding portion 152.

At this time, the first protruding portion 151 partially overlaps with one portion of the gate electrode 120, and the second protruding portion 152 is provided over the gate electrode 120. Accordingly, a region of the active layer 132 that is below the second protruding portion 152 is not influenced by light. However, a region of the active layer 132, which is below the first protruding portion 151 and located at a boundary region of the gate electrode 120, has an increased current due to penetration of photons. Accordingly, electrons charged into the drain electrode 160 when the TFT is off are induced to the source electrode 150 through the region of the active layer 132 below the first protruding portion 151, resulting in an increased current flow. Thus, in this embodiment, the length of the first protruding portion 151 is decreased to reduce an off current flowing from the drain electrode 160 to the source electrode 150 when the TFT is off. A distance, which a photon generated between the gate electrode 120 and the drain contact 165 moves is increased, thereby minimizing an off current induced by the photon.

Further, the present invention is not limited to the foregoing and a portion of the gate electrode may protrude in a direction of the drain electrode to minimize an off current induced by light. A method of manufacturing an LCD including a TFT, which has a gate projecting portion formed of a portion of a gate electrode protruding in a direction of a drain electrode, according to an exemplary embodiment of the present invention will be described below. A description overlapping with the foregoing will be omitted.

Figure 32:
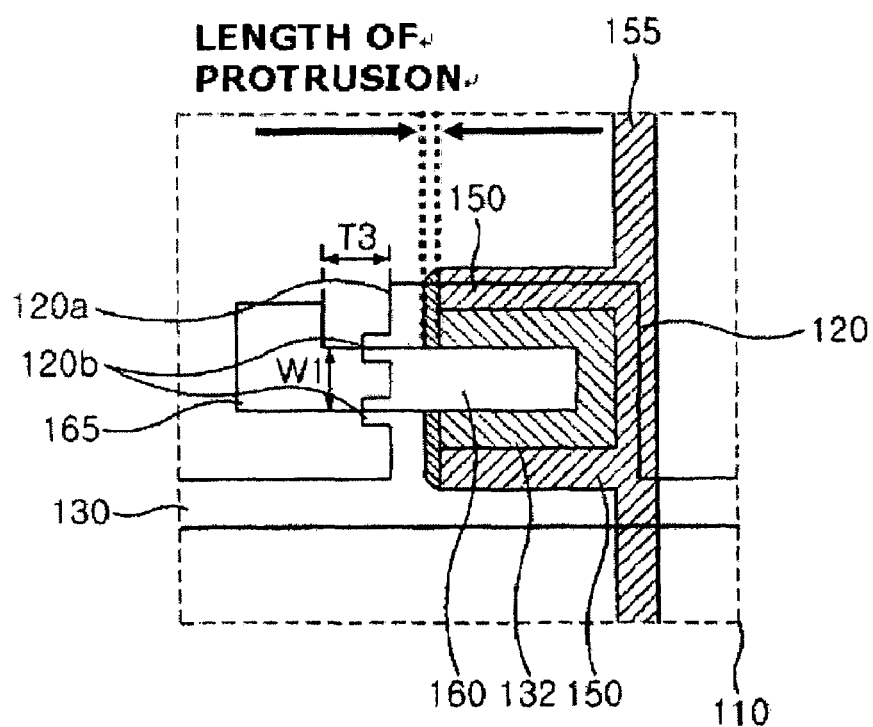
FIG. 32 is a plan view of a TFT region of an LCD according to the exemplary embodiment.
Figure 29:
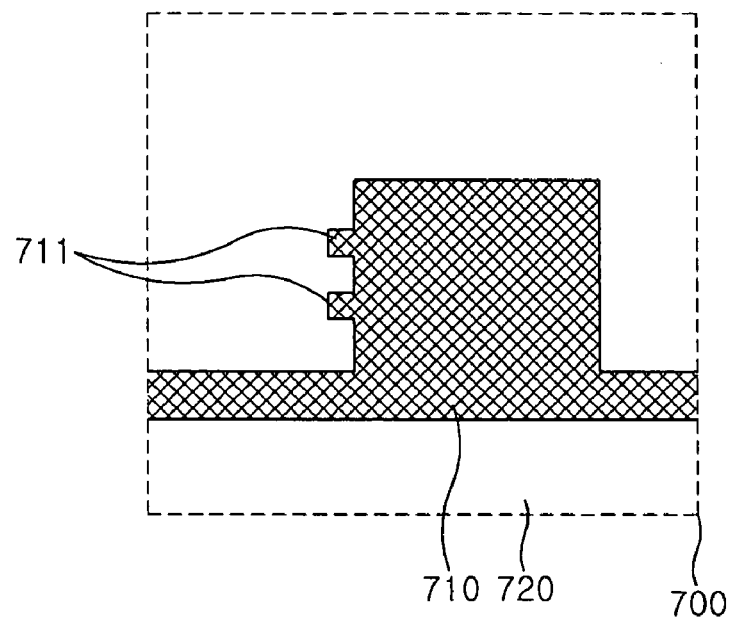
FIG. 29 is a plan view of a mask for a gate electrode according to an exemplary embodiment of the present invention.
Figure 30:
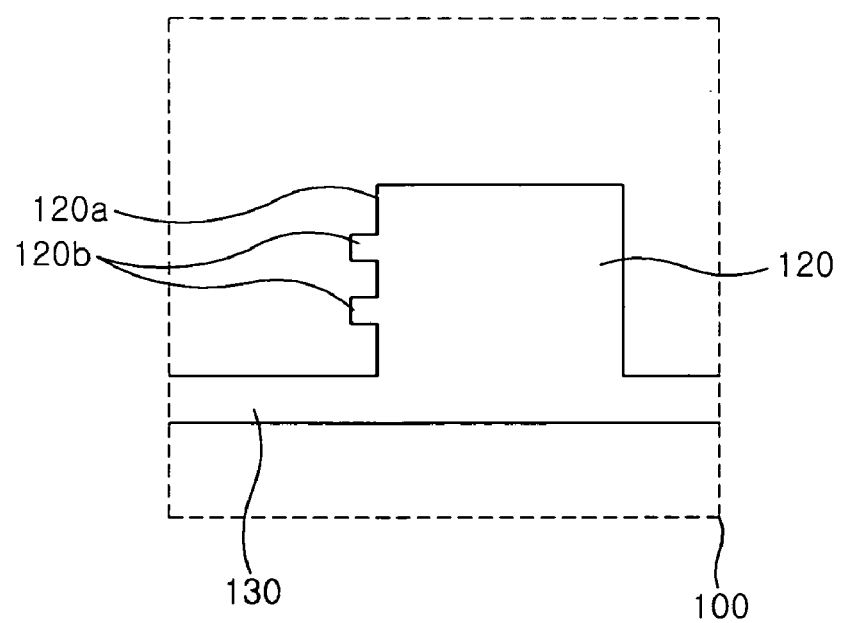
FIG. 30 is a plan view of a substrate on which the gate electrode according to the exemplary embodiment is formed.
Figure 31:
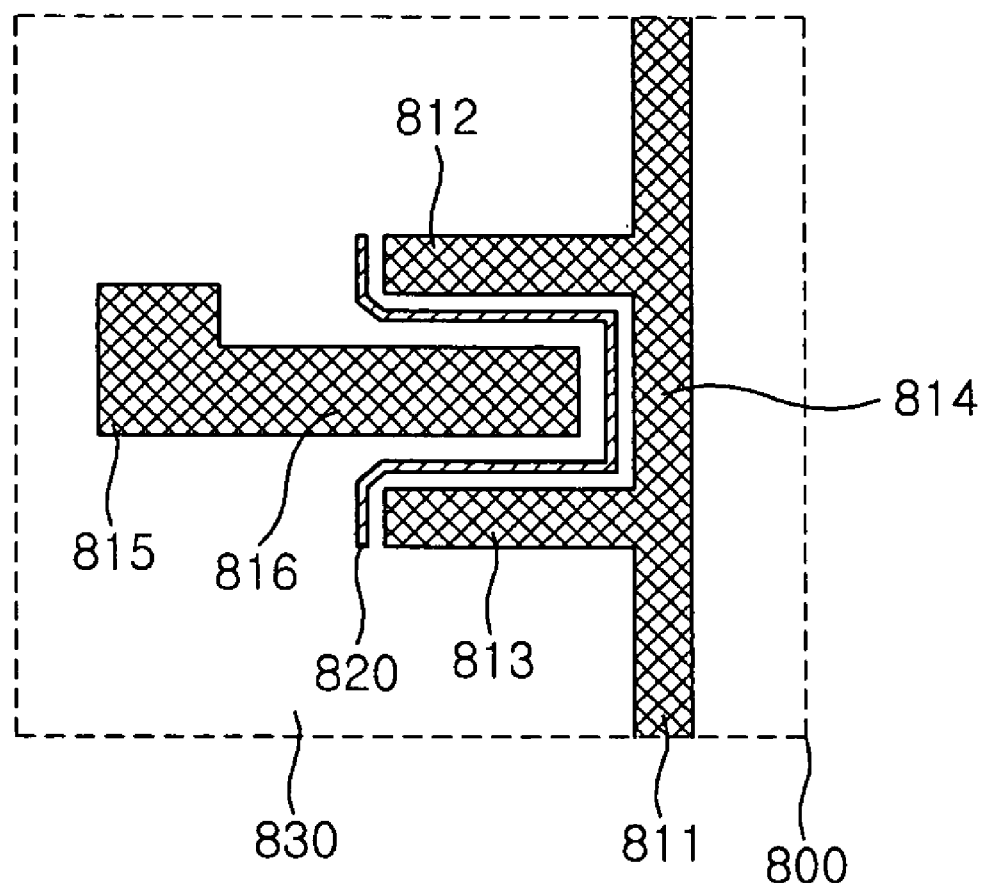
FIG. 31 is a plan view of a mask for forming source and drain electrodes according to the exemplary embodiment.
Figure 33:
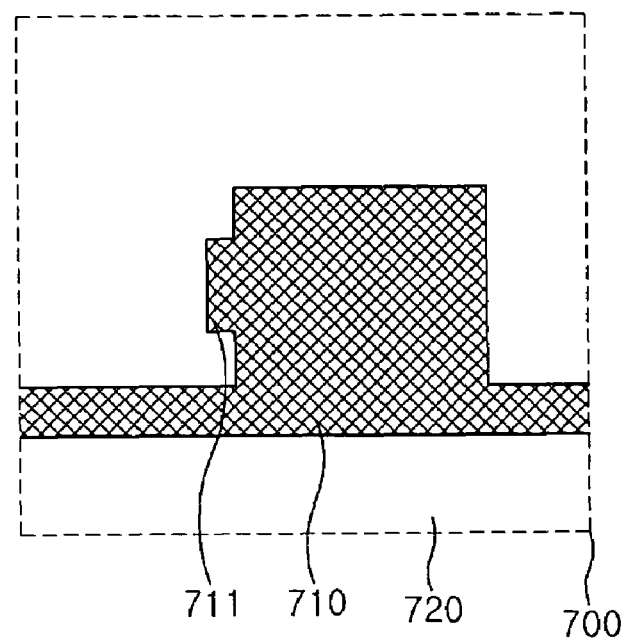
FIG. 33 is a plan view of a mask for forming a gate electrode according to a variant of the exemplary embodiment.

FIG. 29 is a plan view of a mask for a gate electrode according to an exemplary embodiment of the present invention, FIG. 30 is a plan view of a substrate on which the gate electrode is formed, FIG. 31 is a plan view of a mask for forming source and drain electrodes, FIG. 32 is a plan view of a TFT region of an LCD, and FIG. 33 is a plan view of a mask for forming a gate electrode according to an exemplary embodiment of the present invention.

Referring to FIGS. 29 to 33, a mask 700 for a gate electrode according to this embodiment is aligned on a substrate 110 on which a conductive film 121 for a gate electrode and a first photosensitive film 122 are formed. Thereafter, it is preferred that light exposing and developing processes be performed to form a photosensitive mask pattern (not shown), and an etching process is performed using the photosensitive mask pattern to form a gate electrode 120 with a projecting portion 120b protruding in a direction of a drain electrode and a gate line 130 connected thereto as shown in FIG. 30.

As shown in FIG. 29, the mask 700 for a gate electrode comprises a light-shielding portion 710 for shielding gate line and gate electrode regions, and a light-transmitting portion 720 for opening a region except the gate line and gate electrode regions. The light-shielding portion 710 has a projecting portion 711 protruding in the direction of the drain electrode. The projecting portion 711 is formed into two separate regions such that it partially overlaps with both edge regions of the drain electrode 160 fabricated through the following process. It will be apparent that the projecting portion 711 is not limited thereto but may be formed into a single region as shown in FIG. 33. Here, if the width W1 of the drain electrode 160 shown in FIG. 32 is set to be 1, it is preferred that the width of each of the projecting portions 711 formed into the two separate regions be 0.1 to 2. Further, if the distance T3 between the gate electrode 120 and the drain contact 165 is set to be 1, it is preferred that the length of each of the projecting portions 711 be 0.1 to 0.9. At this time, it is preferred that the area of one projecting portion 711 overlapping with the drain electrode be 10 to 90% of the entire area of the projecting portion 711. In this case, it is advantageous that each of the length and width of the projecting portion 711 according to this embodiment is 0.1 to 3 μm.

As shown in FIG. 30, the gate electrode 120 fabricated through the mask 700 for a gate electrode with the aforementioned structure has a rectangular body 120a connected to the gate line 130 and the projecting portions 120b protruding in the direction of the drain electrode 160 from the body 120a.

Thereafter, as described above, a gate insulation film 131, an active layer 132, an ohmic contact layer 133 and a second conductive film 141 are sequentially formed on the gate electrode 120 with the projecting portions 120b. A second photosensitive film is applied to the second conductive film 141, and light exposing and developing processes are then performed using a mask 800 for source and drain electrodes, which is shown in FIG. 31, to form a second photosensitive mask pattern. An etching process is performed using the second photosensitive mask pattern as an etching mask, and the second photosensitive mask pattern is then removed to fabricate a TFT that includes the gate electrode 120 with the projecting portions 120b protruding in the direction of the drain electrode 160, the source electrode 150 provided on the gate electrode 120 and the drain electrode 160 partially overlapping with the projecting portions 120b as shown in FIG. 32. The gate electrode 120 of the TFT is connected to the gate line 130, the source electrode 150 is connected to the source line 155, and the drain electrode 160 is connected to the drain contact 165.

As shown in FIG. 31, the second mask 800 comprises light shielding portions 811, 812, 813, 814, 815, and 817 for shielding the source and drain electrode regions; a translucent portion 820 provided in the channel region between the source and drain electrodes; and a light-transmitting portion 830 provided in a region other than the source electrode region, the source line region, the drain electrode region, and the channel region. The light-shielding portions may be made of a material such as Cr that prevents light transmission.

All of the light shielding portions in the embodiment of FIG. 31 are structured and function the same as the corresponding elements in the embodiment of FIG. 6, as described in detail hereinbefore.

The drain electrode light-shielding portion 816 partially extends into the concave portion formed by the first and second protruding portions of the source electrode light-shielding portions 812, 813 and the connecting portion 814. The translucent portion 820 is in the form of an angled line bent along the inside of the concave portion. As shown in FIG. 31, both ends of the angled-line shaped translucent portion 820 are bent toward the first and second protruding portions 812, 813, thereby preventing the phenomenon in which light is introduced into the concave portion upon exposure to light. The ends of the translucent portion 820 may extend to the width of the first and second portions 812, 813.

In the TFT according to this embodiment, the gate projecting portions 120b are provided in the direction of the drain contact 165, thereby reducing an off current induced due to a phenomenon of electron trapping by light irradiated to a region between the gate electrode 120 and the drain contact 165. This is because the area to which the light is irradiated can be narrowed due to the projecting portions and thus the amount of photons applied to the active layer can be reduced.

Further, the present invention is not limited to the foregoing, and a light-blocking portion for blocking light irradiated to a portion of the active layer below the drain contact may be provided to reduce an off current induced due to a phenomenon of electron trapping by light irradiated to the portion of the active layer below the drain contact. A method of manufacturing an LCD including a TFT, which has a light-blocking portion, according to an exemplary embodiment of the present invention will be described below. A description overlapping with the foregoing will be omitted.

Figure 34:
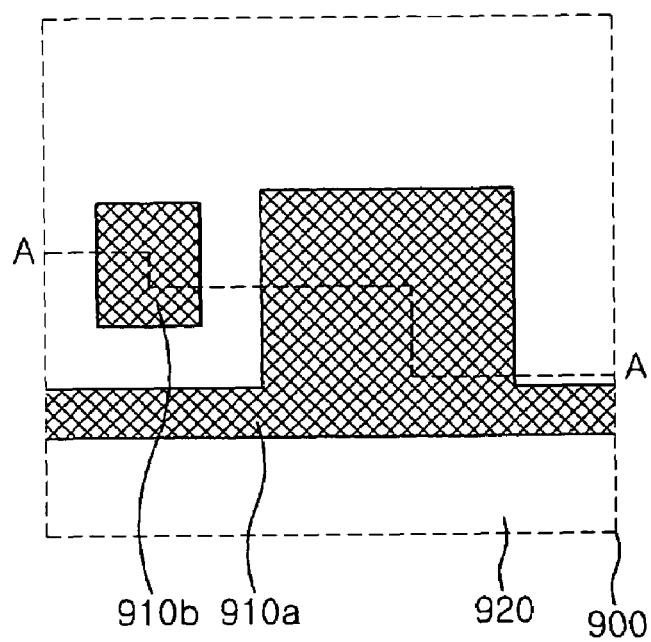
FIG. 34 is a plan view of a mask for forming a gate electrode and a light-blocking portion according to an exemplary embodiment of the present invention.
Figure 35:
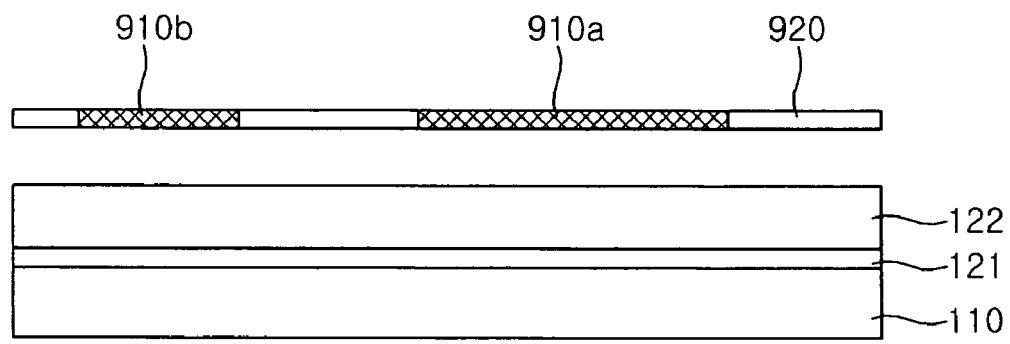
FIGS. 35 to 37 are sectional views taken along line A-A in FIG. 34 to illustrate the formation of the gate electrode and the light-blocking portion according to the exemplary embodiment.
Figure 36:
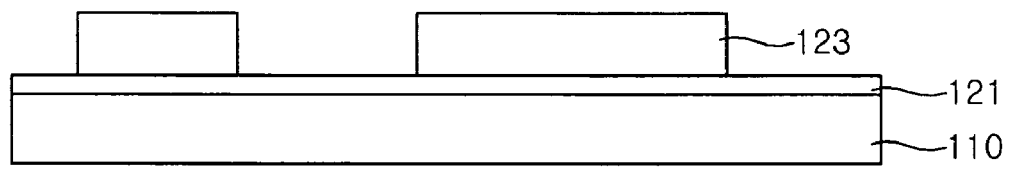
Figure 37:
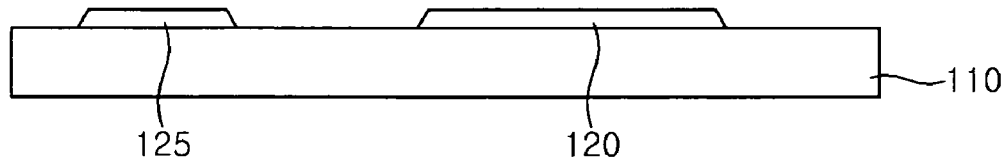
Figure 38:
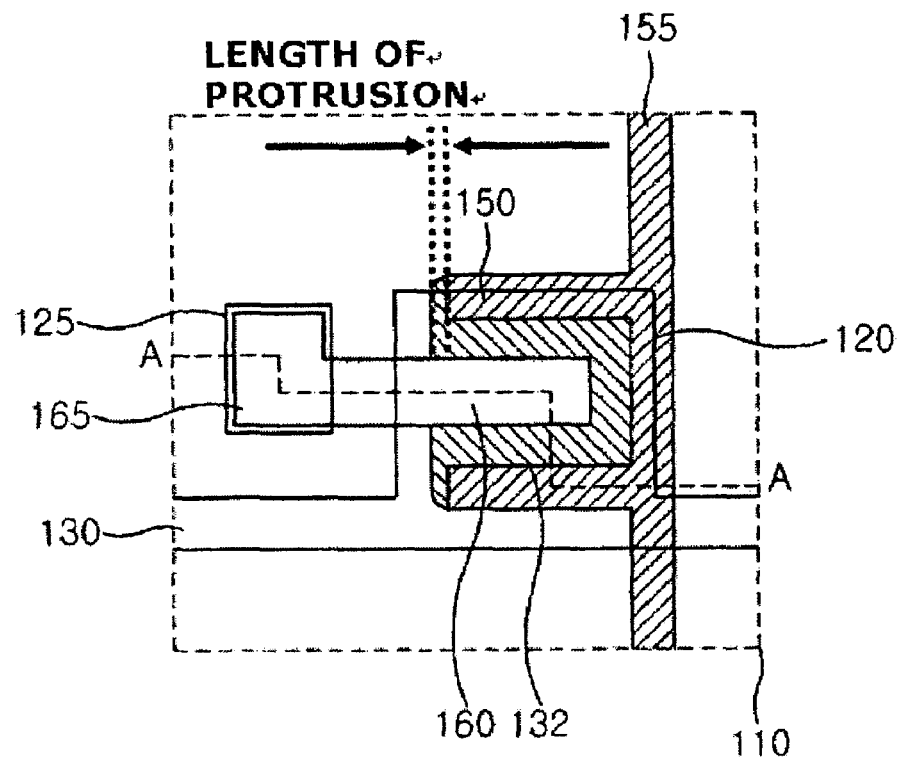
FIG. 38 is a plan view of a TFT region of an LCD according to the exemplary embodiment.
Figure 39:
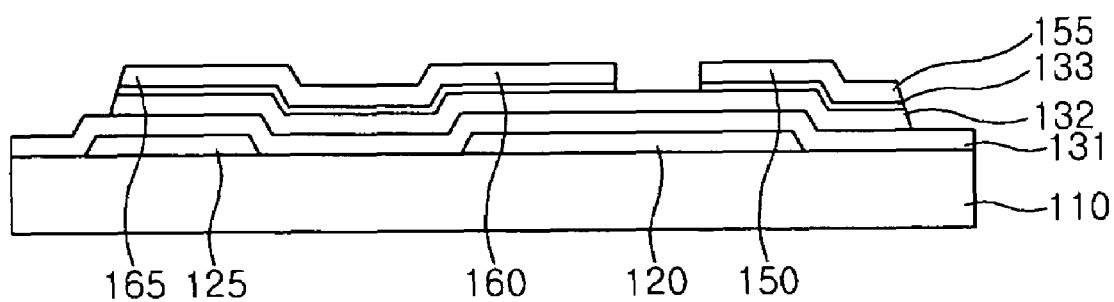
FIG. 39 is a sectional view taken along line A-A in FIG. 38.

FIG. 34 is a plan view of a mask for forming a gate electrode and a light-blocking portion according to an exemplary embodiment of the present invention, FIGS. 35 to 37 are sectional views taken along line A-A in FIG. 34 to illustrate the formation of the gate electrode and the light-blocking portion, FIG. 38 is a plan view of a TFT region of an LCD, and FIG. 39 is a sectional view taken along line A-A in FIG. 38.

Referring to FIGS. 34 to 39, a mask 900 for forming a gate electrode and a light-blocking portion according to this embodiment, and a substrate 10 to which a first conductive film 121 for a gate electrode and a photosensitive film 122 are applied are prepared.

Here, the mask 900 comprises a gate light-shielding portion 910a for shielding gate electrode and gate line regions, a drain contact light-shielding portion 910b for shielding a drain contact region, and a light-transmitting portion 920 for opening a region except the regions of the light-shielding portions 910a and 910b, as shown in FIG. 34. Preferably, the drain contact light-shielding portion 910b is fabricated to take the same shape as the drain contact region and to have an area larger than that of the drain contact region such that light is not irradiated to the drain contact region. If the area of the drain contact region is set to be 1, it is advantageous that the area of the drain contact light-shielding portion 910b is set to be 1 to 1.5.

The mask 900 with the aforementioned gate light-shielding portion 910a and drain contact light-shielding portion 910b is aligned on the substrate 110 to which the photosensitive film 122 is applied, and light exposing and developing processes are then performed to fabricate a first photosensitive maskfilm pattern 123 with a pattern corresponding to the lightshielding portions 910a and 910b, as shown in FIG. 36. Thereafter, an etching process is performed using the first photosensitive mask pattern 123 as an etching mask to remove the first conductive film 121, and the first photosensitive mask pattern 123 is then removed to form a gate electrode 120, a gate line 130 and a light-blocking portion 125 below the drain contact 165.

A gate insulation film 131, an active layer 132, an ohmic contact layer 133 and a second conductive film 141 are sequentially formed on the substrate 110 on which the gate electrode 120 and the light-blocking portion 125 are provided. A second photosensitive film is applied to the top of the second conductive film 141, and light exposing and developing processes are then performed using the mask for source and drain electrodes shown in FIG. 31, thereby forming a second photosensitive mask pattern. Thereafter, it is preferred that an etching process be performed using the second photosensitive mask pattern to form a source electrode 150 above the gate electrode 120, a source line 155 connected to the source electrode 150, the drain contact 165 above the lightblocking portion 125, and a drain electrode 160 extending from the drain contact 165 to above the gate electrode 120, as shown in FIGS. 38 and 39.

As such, in this embodiment, the light-blocking portion 125 is provided below the drain contact 165 so that irradiation of light to a portion of the active layer 132 provided below the drain contact can be blocked, thereby minimizing an off current induced due to a phenomenon of electron trapping by light. That is, the active layer 132 has a minimum area to be exposed to light so that an off current induced by light can be minimized.

Further, the present invention is not limited to the foregoing and contact areas of the source and drain electrodes overlapping with the gate electrode may be set to be identical to each other so that an off current of the TFT can be minimized. A method of manufacturing an LCD including a TFT, which has identical contact areas of source and drain electrodes overlapping with a gate electrode, according to an exemplary embodiment of the present invention will be described below. A description overlapping with the foregoing will be omitted.

Figure 41:
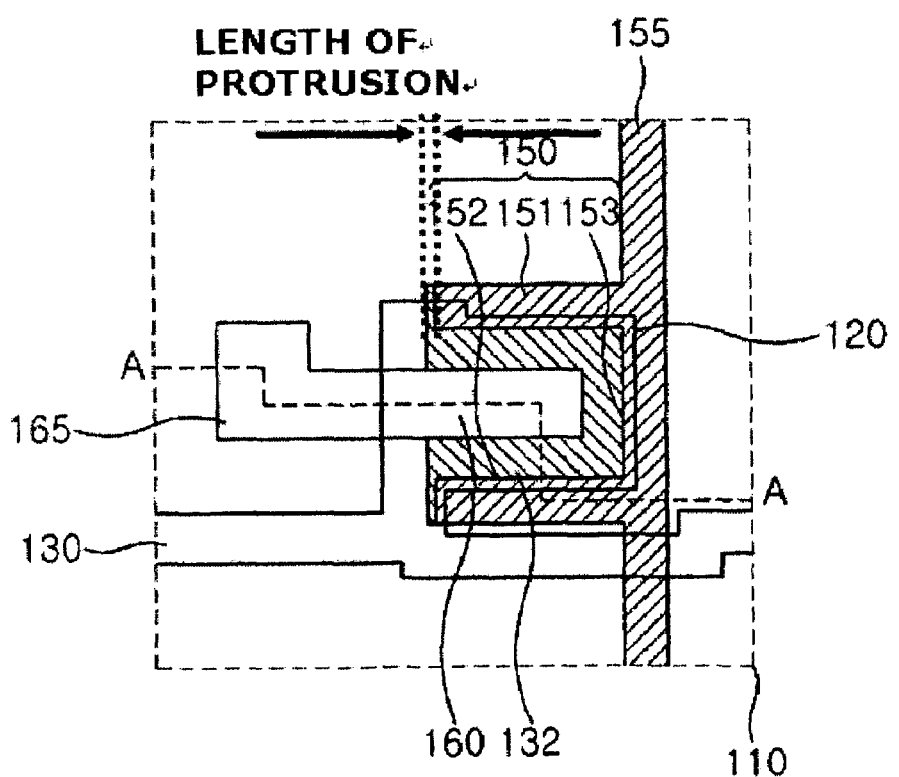
FIG. 41 a plan view of a TFT region of an LCD according to the exemplary embodiment.
Figure 40:
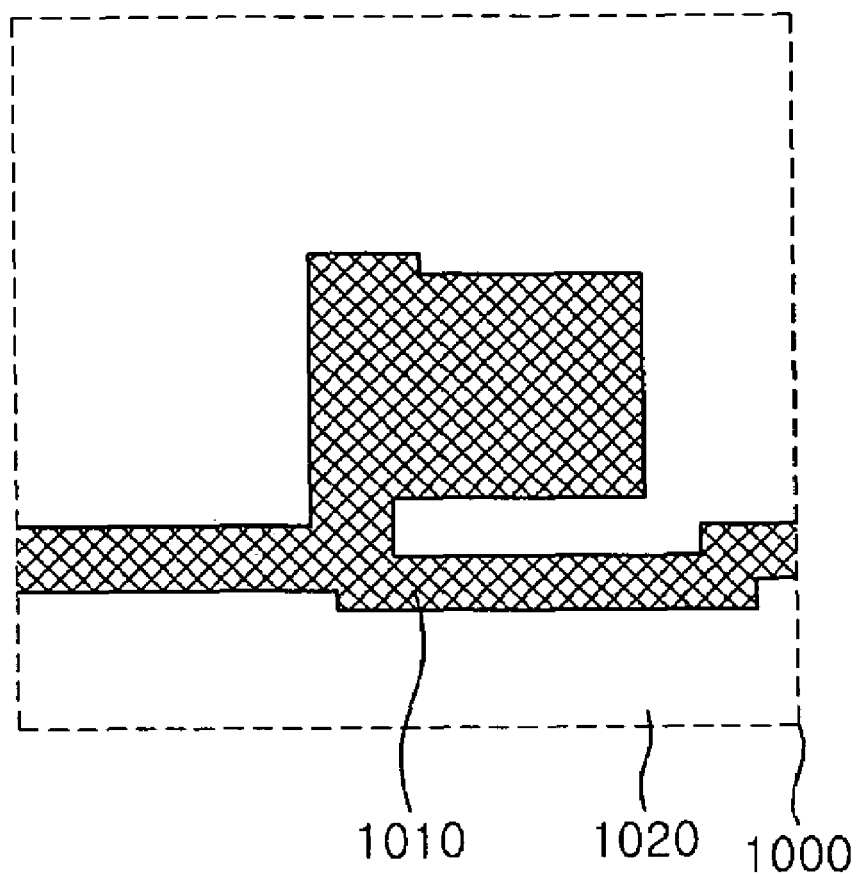
FIG. 40 is a plan view of a mask for forming a gate electrode according to an exemplary embodiment of the present invention.
Figure 42:
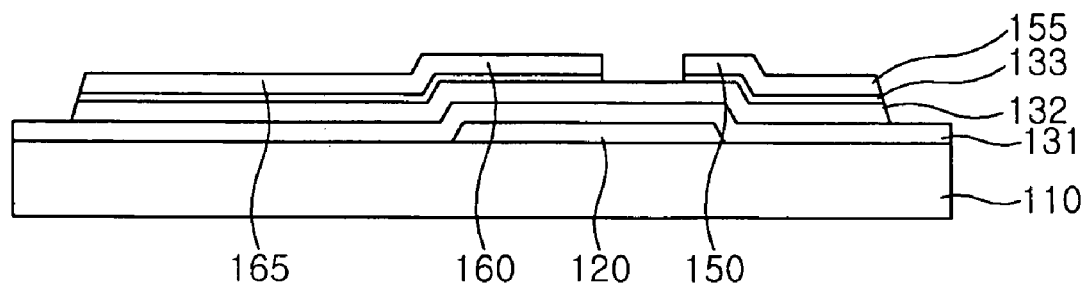
FIG. 42 is a sectional view taken along line A-A in FIG. 41.

FIG. 40 is a plan view of a mask for forming a gate electrode according to an exemplary embodiment of the present invention, FIG. 41 a plan view of a TFT region of an LCD, and FIG. 42 is a sectional view taken along line A-A in FIG. 41.

Referring to FIGS. 40 to 42, in order to form a gate electrode that has identical areas overlapping with drain and source electrodes, a mask 1000 shown in FIG. 40 is aligned on a substrate 110 to which a first conductive film 121 for a gate electrode and a first photosensitive film 122 are applied. Thereafter, light exposing and developing processes are performed using the mask 1000 to form a first photosensitive mask pattern. Thereafter, an etching process is performed using the first photosensitive mask pattern as an etching mask to form the gate electrode 120. A gate insulation film 131, an active layer 132, an ohmic contact layer 133 and a second conductive film 141 are sequentially formed on the substrate 110 on which the gate electrode 120 is formed. A second photosensitive film is applied to the top of the second conductive film 141, and light exposing and developing processes is then performed using the mask for source and drain electrodes shown in FIG. 31, thereby forming a second photosensitive mask pattern. An etching process is performed using the second photosensitive mask pattern to fabricate a TFT having gate, source and drain electrodes 120, 150 and 160 as shown in FIGS. 41 and 42.

At this time, it is preferred that the source electrode 150 comprise first and second protruding portions 151 and 152 and a connecting portion 153 for connecting the protruding portions 151 and 152 to each other, and inner regions of the first and second protruding portions 151 and 152 and the connecting portion 153 partially overlap with the gate electrode 120. Further, it is preferred that the drain electrode 160 extend into a region between the first and second protruding portions 151 and 152 of the source electrode 150.

In this embodiment, it is preferred that the respective overlapping areas of the first and second protruding portions 151 and 152 and connecting portion 153 with the gate electrode 120 be set to be smaller than those in the previous embodiments so that respective overlapping areas of the source and drain electrodes 150 and 160 with the gate electrode 120 can be identical to each other.

To this end, it is advantageous that the area of a region where a light-shielding portion 1010 of the mask 1000 for forming a gate electrode overlaps with the source electrode 150 is set to be small as shown in FIG. 40. If the overlapping area of the drain electrode 160 with the gate electrode 120 is set to be 1, it is preferred that the gate electrode 120 be patterned such that each of the overlapping areas of the first and second protruding portions 151 and 152 with the gate electrode 120 is 0.1 to 0.8, and the overlapping area of the connecting portion 153 with the gate electrode 120 is 0.1 and 0.8.

Since all first and second protruding portions and a connecting portion of a source electrode overlap with a gate electrode to a degree exceeding a predetermined area, the overlapping area of the source electrode is larger than that of a drain electrode of which only a single extending portion overlaps with the gate electrode. Accordingly, the capacitance of a capacitor defined by the source and gate electrodes is larger than that of a capacitor defined by the drain and gate electrodes. Thus, an off current is generated due to difference in capacitance between the source and gate electrodes, and the drain and gate electrodes. However, this embodiment can prevent the off current due to such difference in capacitance by causing the overlapping areas of them to be identical to each other. Further, it is possible to prevent a difference in electrical currents between forward and reverse biases.

This embodiment is not limited to the foregoing and the width of the protruding portion of the source electrode may be formed to be small so that overlapping areas of the source and drain electrodes with the gate electrode can be identical to each other.

Figure 43:
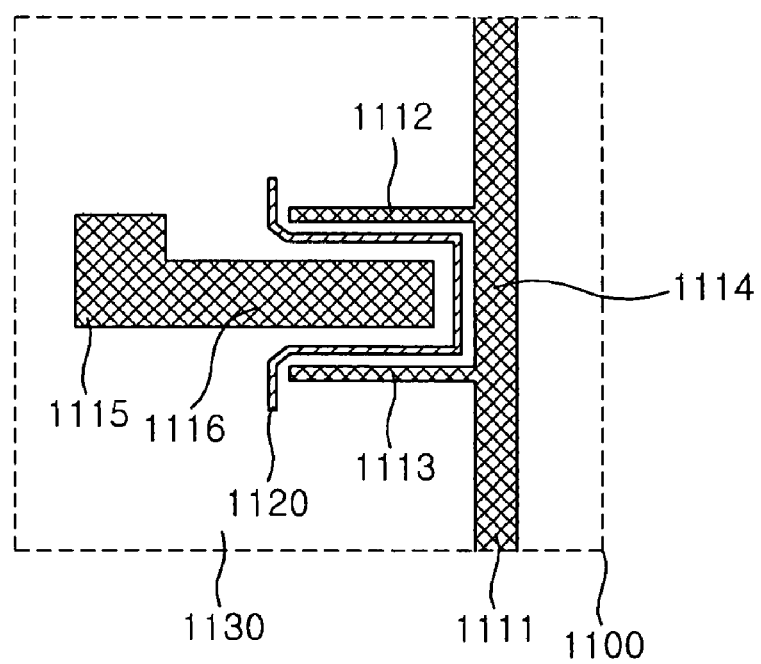
FIG. 43 is a plan view of a mask for forming source and drain electrode according to an exemplary embodiment.
Figure 44:
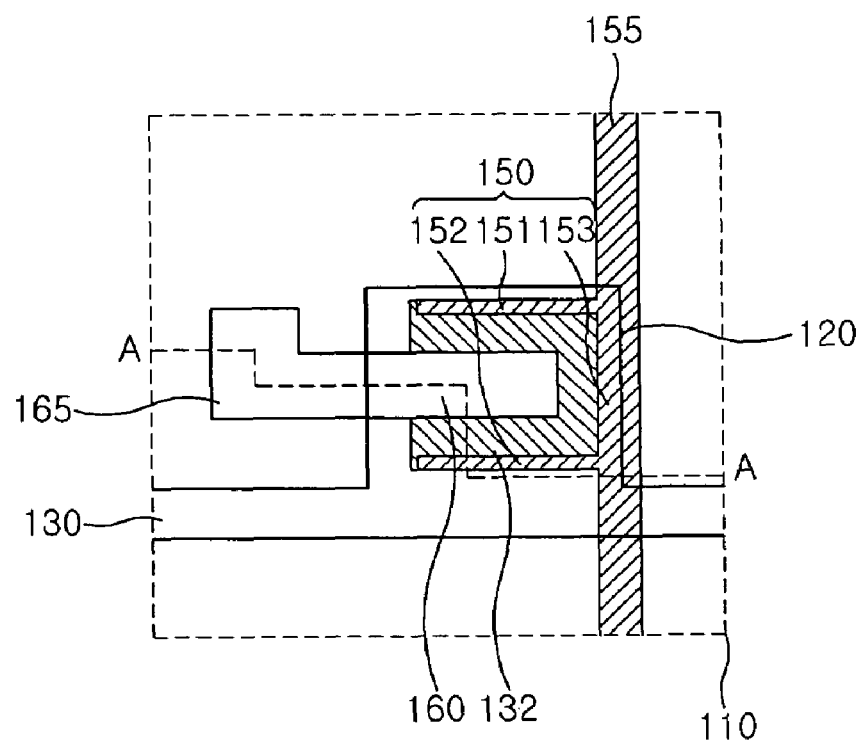
FIG. 44 is a plan view of a TFT region of an LCD according to the exemplary embodiment.
Figure 45:
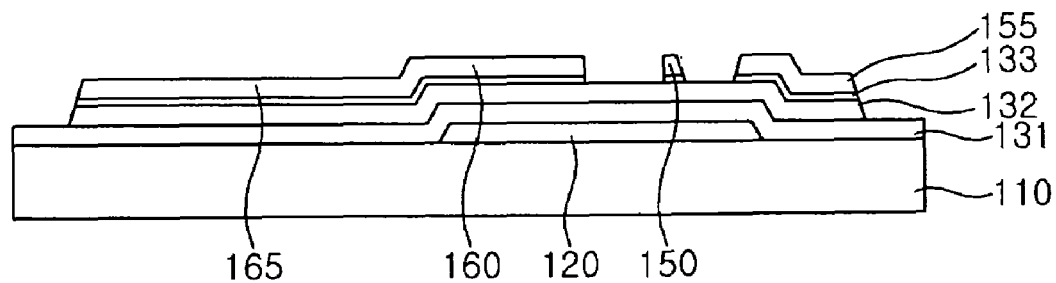
FIG. 45 is a sectional view taken along line A-A in FIG. 44.

FIG. 43 is a plan view of a mask for forming source and drain electrode according to an exemplary embodiment, FIG. 44 is a plan view of a TFT region of an LCD, and FIG. 45 is a sectional view taken along line A-A in FIG. 44.

As shown in FIGS. 43 to 45, it is preferred that the widths of first and second protruding portions 151 and 152 of the source electrode 150 be set to be small so that the overlapping area of the source electrode 150 with the gate electrode 120 can be identical with that of the drain electrode 160 with the gate electrode 120.

To this end, as shown in FIG. 43, a mask 1100 for forming source and drain electrodes manufactured such that the widths of first and second protruding portions 1112 and 1113 of source light-shielding portions 1111, 1112, 1113 and 1114 are smaller than that of a drain light-shielding portion 1116, is aligned on a substrate 110 on which the gate electrode 120 is patterned and then a gate insulation film 131, an active layer 132, an ohmic contact layer 133, a second conductive film 134 and a second photosensitive film 141 are sequentially laminated. Light exposing and developing processes are performed using the mask 1100 to form the second photosensitive mask pattern, and an etching process is performed using the second photosensitive mask pattern to form the source electrode 150 with the first and second protruding portions 151 and 152 and a connecting portion 153 for connecting them, the source line 155 connected to the connecting portion 153, a drain electrode 160, and a drain contact 165 connected to the drain electrode 160, thereby fabricating a TFT.

At this time, it is preferred that the overlapping area of the drain electrode 160 with the gate electrode 120 be identical with that of the source electrode 150 with the gate electrode 120. Here, if the overlapping area of the drain electrode 160 with the gate electrode 120 is set to be 1, it is preferred that the overlapping area of each of the first and second protruding portions 151 and 152 with the gate electrode 120 be 0.1 to 0.6, and the overlapping area of the connecting portion 153 with the gate electrode 120 be 0.1 and 0.8.

As such, in this embodiment, the width of the protruding portion of the source electrode is set to be small so that the overlapping area of the source electrode with the gate electrode can be identical with that of the drain electrode with the gate electrode, thereby preventing an off current due to a difference in capacitance.

Although the respective embodiments have been independently described above, they may be implemented as a combination thereof.

As described above, according to the present invention, the area in which electrons can move, between source and drain electrodes is minimized and the moving distance of electrons is increased to decrease an off current induced due to a phenomenon of electron trapping by light.

Further, the phenomenon of electron trapping by light is reduced through optimization of an active layer exposed by a slit mask between source and drain electrodes, thereby decreasing an off current.

Furthermore, the length of a portion of a source electrode overlapping with an edge of a gate electrode is decreased to reduce the phenomenon of electron trapping by light, resulting in a decrease of an off current.

In addition, a gate electrode extends to protrude in a direction of a drain electrode, so that the amount of light irradiated to the outside of the gate electrode can be decreased and thus an off current can be decreased.

Moreover, a light-blocking portion is provided below a drain contact to reduce light introduction, thereby decreasing an off current.

Further, respective overlapping areas of source and drain electrodes with the gate electrode are identical to each other so as to minimize an off current when a TFT is off.

While the present invention has been described in connection with the preferred embodiments, it will be understood by those skilled in the art that various modifications and changes can be made thereto without departing from the spirit and scope of the invention defined by the appended claims.

What is claimed is:

1. A thin film transistor substrate, comprising:
   a plurality of gate lines;
   a plurality of source lines intersecting the gate lines;
   a plurality of pixel electrodes provided respectively in a plurality of pixel regions defined by the pluralities of gate and source lines; and
   a plurality of thin film transistors provided respectively in the plurality of pixel regions, each of the plurality of thin film transistors including a gate electrode connected to one of the plurality gate lines, a source electrode connected to one of the plurality of source lines, and a drain electrode connected to one of the plurality of pixel electrodes,
   wherein an active layer is exposed in a channel region provided between the source and drain electrodes of each of the plurality of thin film transistors, and if the active layer protrudes outside the channel region by extending from the channel region, the active layer protrudes by a length of up to 30% or less of a width of the source line,
   wherein each of the plurality of source electrodes includes first and second protruding portions extending from the corresponding source line,
   wherein the first protruding portion partially overlaps with an edge of the gate electrode so that part of the first protruding portion, including an entire edge of a side of the first protruding portion, is located outside of an overlapping area between the gate electrode and the first protruding portion.

2. The thin film transistor substrate as claimed in claim 1, wherein
   a length of the first protruding portion differs from a length of the second protruding portion, and
   wherein the overlapping area between the first protruding portion and the gate electrode differs from an overlapping area between the second protruding portion and the gate electrode.

3. The thin film transistor substrate as claimed in claim 1, wherein the gate electrode includes a projecting portion formed such that a portion of the gate electrode protrudes in a direction of the drain electrode, and the projecting portion partially overlaps with an edge of the drain electrode.

4. The thin film transistor substrate as claimed in claim 1, wherein the drain electrode includes a drain contact connected to one of the pixel electrodes, and a light-blocking portion is provided below the drain contact.

5. The thin film transistor substrate as claimed in claim 1, wherein the first and second protruding portions extend from the corresponding source line to form a substantial U shape with the source line, and a portion of the drain electrode extends into a region between the first and second protruding portions,
   wherein a length of the first protruding portion differs from a length of the second protruding portion, and wherein the overlapping area between the first protruding portion and the gate electrode differs from an overlapping area between the second protruding portion and the gate electrode.

6. The thin film transistor substrate as claimed in claim 1, wherein the first and second protruding portions partially overlap with the gate electrode, connecting portion connects the first and second protruding portions, and an overlapping area of the gate electrode with the first and second protruding portions and the connecting portion is equal to an overlapping area of the gate electrode with the drain electrode.

7. A thin film transistor substrate, comprising:
a plurality of gate lines;
a plurality of source lines intersecting the plurality of gate lines;
a plurality of pixel electrodes respectively provided in a plurality of pixel regions defined by the pluralities gate and source lines; and
a plurality of thin film transistors respectively provided in the plurality of pixel regions, each of the plurality of thin film transistors including a gate electrode connected to one of the plurality of gate lines, a source electrode connected to one of the plurality of source lines, and a drain electrode connected to one of the plurality of pixel electrodes,
wherein the source electrode includes first and second protruding portions extending to edges of the gate electrode and a connecting portion connecting the first and second protruding portions to each other, and
wherein the first protruding portion partially overlaps with an edge of the gate electrode so that part of the first protruding portion, including an entire edge of a side of the first protruding portion, is located outside of an overlapping area between the gate electrode and the first protruding portion, and the lengths of the first protruding portion is smaller than the length of the second protruding portions.

8. A thin film transistor substrate, comprising:
a plurality of gate lines;
a plurality of source lines intersecting the plurality gate lines;
a plurality of pixel electrodes respectively provided in a plurality of pixel regions defined by the plurality of gate and source lines; and
a plurality of thin film transistors respectively provided in the plurality of pixel regions, each of the thin film transistors including a gate electrode connected to one of the plurality of gate lines, a source electrode connected to one of plurality of the source lines, and a drain electrode connected to one of the plurality of pixel electrodes,
wherein the gate electrode includes a projecting portion formed such that a portion of the gate electrode protrudes in a direction of the drain electrode, and the projecting portion partially overlaps with both edges of the drain electrode,
wherein an active layer is formed below the source lines, the source electrode, and the drain electrode,
wherein the active layer is exposed in a channel region provided between the source and drain electrodes of said each of the plurality of thin film transistors,
wherein the source electrode of source electrodes includes first and second protruding portions extending from the corresponding source line to form a substantial U shape with the source line, and a portion of the drain electrode extends into a region between the first and second protruding portions, and
wherein the projecting portion includes first and second projections, the first projection partially overlaps with one edge of the drain electrode, and the second projection partially overlaps with the other edge of the drain electrode.

9. A thin film transistor substrate, comprising:
a plurality of gate lines;
a plurality of source lines intersecting the plurality of gate lines;
a plurality of pixel electrodes provided respectively in a plurality of pixel regions defined by the plurality of gate and source lines; and
a plurality of thin film transistors respectively provided in the plurality of pixel regions, each of the plurality of thin film transistors including a gate electrode connected to one of the plurality of gate lines, a source electrode connected to one of the plurality of source lines, and a drain electrode connected to one of the plurality of pixel electrodes,
wherein the drain electrode includes a drain contact connected to one of the plurality of pixel electrodes, and a light-blocking portion is provided below the drain contact,
wherein the source electrode includes first and second protruding portions extending toward both edges of the gate electrode and a connecting portion connecting the first and second protruding portions to each other,
a portion of the drain electrode extends into a region between the first and second protruding portions,
an active layer is exposed in a channel region provided between the source and drain electrodes, and
if the active layer protrudes outside the channel region, the active layer protrudes by a length of up to 30% or less of a width of the source line,
wherein the light-blocking portion is provided on a same plane as the gate electrode.

10. A thin film transistor substrate, comprising:
a plurality of gate lines;
a plurality of source lines intersecting the plurality gate lines;
a plurality of pixel electrodes respectively provided in a plurality of pixel regions defined by the pluralities of gate and source lines; and
a plurality of thin film transistors respectively provided in the plurality of pixel regions, each of the thin film transistors including a gate electrode connected to one of the plurality of gate lines, a source electrode connected to one of the plurality of source lines, and a drain electrode connected to one of the plurality of pixel electrodes,
wherein the source electrode includes first and second protruding portions partially overlapping with the gate electrode, and a connecting portion connecting the first and second protruding portions, and
an overlapping area of the gate electrode with the first and second protruding portions and the connecting portion is equal to an overlapping area of the gate electrode with the drain electrode.

* * * * *